(12) United States Patent
Venkatasubramanian

(10) Patent No.: US 7,164,077 B2
(45) Date of Patent: Jan. 16, 2007

(54) THIN-FILM THERMOELECTRIC COOLING AND HEATING DEVICES FOR DNA GENOMIC AND PROTEOMIC CHIPS, THERMO-OPTICAL SWITCHING CIRCUITS, AND IR TAGS

(75) Inventor: Rama Venkatasubramanian, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 840 days.

(21) Appl. No.: 10/118,236

(22) Filed: Apr. 9, 2002

(65) Prior Publication Data

US 2002/0174660 A1 Nov. 28, 2002

Related U.S. Application Data

(60) Provisional application No. 60/282,185, filed on Apr. 9, 2001.

(51) Int. Cl.
*H01L 35/00* (2006.01)
(52) U.S. Cl. ............... 136/203; 257/108; 435/6
(58) Field of Classification Search ........... 136/203, 136/204; 257/108; 435/6
See application file for complete search history.

(56) References Cited

U.S. PATENT DOCUMENTS

| | | | |
|---|---|---|---|
| 3,136,134 A | 6/1964 | Smith | |
| 3,296,034 A | 1/1967 | Reich | |
| 3,607,444 A | 9/1971 | Debucs | |
| 3,663,307 A | 5/1972 | Mole | |
| 4,443,650 A | 4/1984 | Takagi et al. | |
| 5,006,178 A | 4/1991 | Bijvoets | |
| 5,254,178 A | 10/1993 | Yamada et al. | |
| 5,430,322 A | 7/1995 | Koyanagi et al. | |
| 5,837,929 A * | 11/1998 | Adelman | 136/225 |

(Continued)

FOREIGN PATENT DOCUMENTS

EP 0 687 020 12/1995

(Continued)

OTHER PUBLICATIONS

Oct. 9, 2001, Embargoed until 2 p.m. EDT Oct. 10, 2001, Media Contact: Reid Maness, crn@rti.org, 919-541-7044, New Thermoelectric Materials Can Keep Chips Cool Advances in Fiber Optics and in Biotechnology also are Likely Annual Report 2001, Turning Knowledge into Practice, pp. 4-37.

(Continued)

*Primary Examiner*—Nam Nguyen
*Assistant Examiner*—Anthony Fick
(74) *Attorney, Agent, or Firm*—Myers Bigel Sibley & Sajovec

(57) ABSTRACT

A thermoelectric cooling and heating device including a substrate, a plurality of thermoelectric elements arranged on one side of the substrate and configured to perform at least one of selective heating and cooling such that each thermoelectric element includes a thermoelectric material, a Peltier contact contacting the thermoelectric material and forming under electrical current flow at least one of a heated junction and a cooled junction, and electrodes configured to provide current through the thermoelectric material and the Peltier contact. As such, the thermoelectric cooling and heating device selectively biases the thermoelectric elements to provide on one side of the thermolectric device a grid of localized heated or cooled junctions.

77 Claims, 12 Drawing Sheets

U.S. PATENT DOCUMENTS

| | | | |
|---|---|---|---|
| 5,865,975 | A | 2/1999 | Bishop |
| 5,869,242 | A | 2/1999 | Kamb |
| 5,874,219 | A | 2/1999 | Rava et al. |
| 5,900,071 | A | 5/1999 | Harman |
| 5,922,988 | A | 7/1999 | Nishimoto |
| 6,060,331 | A | 5/2000 | Shakouri et al. |
| 6,060,657 | A | 5/2000 | Harman |
| 6,062,681 | A | 5/2000 | Field et al. |
| 6,071,351 | A | 6/2000 | Venkatasubramanian |
| 6,072,925 | A | 6/2000 | Sakata |
| 6,084,050 | A | 7/2000 | Ooba et al. |
| 6,094,919 | A | 8/2000 | Bhatia |
| 6,154,266 | A | 11/2000 | Okamoto et al. |
| 6,154,479 | A | 11/2000 | Yoshikawa et al. |
| 6,180,351 | B1 | 1/2001 | Cattell |
| 6,271,459 | B1 | 8/2001 | Yoo |
| 6,282,907 | B1 | 9/2001 | Ghoshal |
| 6,300,150 | B1 | 10/2001 | Venkatasubramanian |
| 6,365,821 | B1* | 4/2002 | Prasher ..................... 136/201 |
| 6,384,312 | B1 | 5/2002 | Ghoshal et al. |
| 6,403,876 | B1 | 6/2002 | Ghoshal et al. |
| 6,410,971 | B1 | 6/2002 | Otey |
| 6,412,286 | B1 | 7/2002 | Park et al. |
| 6,505,468 | B1 | 1/2003 | Venkatasubramanian |
| 6,605,772 | B1 | 8/2003 | Harman et al. |
| 6,696,635 | B1 | 2/2004 | Prasher |
| 2001/0052234 | A1 | 12/2001 | Venkatasubramanian |
| 2002/0053359 | A1 | 5/2002 | Harman et al. |
| 2002/0069906 | A1 | 6/2002 | Macris |
| 2002/0139123 | A1* | 10/2002 | Bell ............................ 62/3.7 |

FOREIGN PATENT DOCUMENTS

| | | |
|---|---|---|
| EP | 0 805 501 | 11/1997 |
| JP | 6-97512 | 4/1994 |
| WO | WO98/43740 | 10/1998 |
| WO | WO98/44562 | 10/1998 |
| WO | WO 00/49664 | 8/2000 |
| WO | WO 01/08800 | 2/2001 |

OTHER PUBLICATIONS

Thin-Film Thermoelectric Devices with High Room-Temperature Figures of Merit, Rama Venkatasubramanian et al., Research Triangle Institute, Research Triangle Park, North Carolina 27709, USA, 2001 Macmillan Magazines Ltd., Nature, vol. 413, Oct. 11, 2001, www.nature.com pp. 597-602.

In-situ Monitoring of the Growth of $Bi_2 Te_3$ and $Sb_2 Te_3$ Films and $Bi_2 Te_3$-$Sb_2Te_3$ Superlattice Using Spectroscopic Eillipsometry Hao Cui et al. Journal of Electronic Materials, vol. 30, No. 11 2001, Special Issue Paper, pp. 1376-1381.

Thermal Characterization of $Bi_2 Te_3$ /$Sb_2Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson[a)] Electronic mail, goodson@vk.standord.edu, Journal of Applied Physics, vol. 90, No. 2, Jul. 15, 2001, pp. 763-767.

Smaller, Faster, Efficient Thermoelectric Cooling, Rama Venkatasubramanian, vol. 30, No. 41, Oct. 17, 2001 ISSN: 0300-757X, pp. 1-2.

CVD Diamond for Components and Emitters, J. Davidson*, *Corresponding Author, e-mail address: jld@vuse.vanderbilt.edu (J.Davidson) et al.,Vanderbilt University, 2201 West End Avenue, Nashville, TN 37235, USA, Diamond and Related Materials 10 (2001) pp. 1736-1742.

Sneak Preview, Optical Device Transfers Data Fast, Rama Venkatasubramanian, design news Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolinia 27709, Physical Review B, vol. 61, No. 4, Jan. 15, 2000-II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-686.

RTI Research Yields Major Advance in Thermoelectrics, Rama Venkatasubramanian et al., pp. 8-9.

Cooling Film Tempers Tiny Hot Spots, Rama Venkatasubramanian et al., Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, N.C., Chapter 4, Semiconductors and Semimetals, vol., pp. 175-201.

The New Face of A.I., Michael Powell, Merger Maniac Europe's CD Underworld, The Supercheap Future of Flying, Mar. 2002, Hacking the Racetrack, Inside Nuke University, Wired, A New Kind of Cool, Rama Venkatasubramanian.

Improved Photoluminescence of GaAs In ZnSe/GaAs Heterojunctions grown by Organometallic Epitaxy, S.K. Ghandhi, et al., Electrical Computer, and Systems Engineering Department, Rensselaer Polytechnic Institute, Troy, New York 12180, Appl. Phys. Lett., vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, North Carolina 27709, J. Appl. Phys., vol. 66, No. 11, Dec. 1, 1989, pp. 5662-5664.

Incorporation Processes in MBE Growth of ZnSe, Rama Venkatasubramanian et al., Journal of Crystal Growth 95 (1989) pp. 533-537.

Radiative Recombination in Surface-free $n^+In$ $In^+GaAs$ Homostructures, L.M. Smith and D.J. Wolford et al., Appl. Phys. Lett., vol. 57, No. 15, Oct. 8, 1990, pp. 1572-1574.

Measurement of AlGaAs/AlGaAs Interface Recombination Velocities Using Time-Resolved Photoluminescence, M.L. Timmons, et al., Appl. Phys. Lett., vol. 56, No. 19, May 7, 1990, pp. 1850-1852.

Development of Low-Bandgap Ge and $Si_{0.07}Ge_{0.03}$ Solar Cells For Monolithic and Mechanically-Stacked Cascade Applications, Rama Venkatasubramanian et al., pp. 73-78.

Graded-Band-GAP AlGaAs Solar Cells For AlGaAs/Ge Cells, M.L. Timmons, et al., pp. 68-72.

Photoexcited Carrier Lifetimes and Spatial Transport in Surface-free GaAs Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}As$ Interface, Rama Venkatasubramanian et al., Appl. Phys. Lett., vol. 59, No. 3, Jul. 15, 1991, pp. 319-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1604-1605.

GaInAsP Lattice Matched to GaAs for Solar Cell Applications, P.R. Sharps, et al., Research Triangle Institute, P.O. Box 12194, RTP, NC 27709, pp. 315-317.

High-Temperature Performance and Radiation Resistance of High-Efficiency Ge and $Si_{0.07}Ge_{0.03}$ Solar Cells on Lightweight Ge Substrate, Rama Venkatasubramanian et al., pp. 85-98.

Physical Basis and Characteristics of Light Emission From Quantized Planar Ge Structures, Rama Venkatasubramanian, et al., pp. 15.4.1-15.4.4.

High Quality GaAs on Si Using $Si_{0.04}Ge_{0.96}$/Ge Buffer Layers, Rama Venkatasubramanian et al., Journal of Crystal Growth 107 (1991) pp. 489-493.

Optimization of the Heteroepitaxy of Ge on GaAs for Minority-Carrier Lifetime, Rama Venkatasubramanian, et al., Journal of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B, vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354.

High-Quality Eutectic-Metal-Bonded AlGaAs-GaAs Thin Films on Si Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C. Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al., Inst. Phys. Conf. Ser. No. 120: Chapter 9, pp. 401-406.

Properties and Use of Cycled Grown OMVPE GaAs:Zn, GaAs:Se, and GaAs:Si Layers for High-Conductance GaAs Tunnel Junctions, Rama Venkatasubramanian et al., National Renewable Energy Laboratory, Golden, CO 80401, pp. 893-899.

15.8%-Efficient (1-SUN, AM 1.5G) GaAs Solar Cell on Optical-Grade Polycrystalline Ge Substrate, Rama Venkatasubramanian et al., National Renewable Energy Laboratory, Golden, CO 80401, pp. 691-695.

Development of 20% Efficient GaInAsP Solar Cells, P.R. Sharps, et al., pp. 633-638.

Development of High-Efficiency $Al_{0.2}Ga_{0.8}As$ Solar Cells and Interconnect Schemes For $Al_{0.2}Ga_{0.3}As$/Si Mechanically-Stacked Cascade Cells, Rama Venkatasubramanian, et al., pp. 752-756.

Photoreflectance Characterization of InP and GaAs Solar Cells, R.G. Rodrigues et al., pp. 681-685.

Close-Packard Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, pp. 1938-1941.

GaAs and $Al_{0.2}Ga_{0.6}As$ Solar Cells With An Indirect-Bandgap $Al_{0.6}Ga_{0.2}As$ Emitter—Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC; Dec. 5-9, 1994; Hawaii, pp. 1839-1842.

The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.

Material and Device Characterization Toward High-Efficiency GaAs Solar Cells on Optical-Grade Polycrystalline Ge Substrates, Rama Venkatasubramanian, et al, R. Ahrenkiel, et al., First WCPEC; Dec. 5-9, 1994; Hawaii, pp. 1692-1696.

Silicon and GAAS/GE Concentrator Power Plants: A Comparison of Cost of Energy Produced, R.A. Whisnant et al., First WCPEC; Dec. 5-9, 1994; Hawaii, pp. 1103-1106.

Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.

High-Efficiency Tandem Solar Cells on Single- and Poly-Crystalline Substrates, J.A. Hutchby et al., Center for Semiconductor Research, Research Triangle Institute, Research Triangle Park, NC 27709, USA, Solar Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al.,Solid-State Electronics vol. 37, No. 11, pp. 1809-1815, 1994.

Heteroepitaxy and Characterization of Ge-rich SiGe Alloys on GaAs, Rama Venkatasubramanian et al., C.T. Kao and N.R. Parikh,J. Appl. Phys., vol. 65, No. 9, May 1, 1989, pp. 8164-8167.

18.2% (AM1.5) Efficient GaAs Solar Cells on Optical-Grade Polycrystalline Ge Substrate, Rama Venkatasubramanian et al., National Renewable Energy Laboratory (NREL), Golden, CO 80401, 25th PVSC; May 13-17, 1996; Washington, D.C. pp. 31-36.

Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, 15th International Conference on Thermoelectrics (1996), pp. 454-458.

Thermal Conductivity of Si-Ge Superlattices, S.-M. Lee and David G. Cahill[a)], Rama Venkatasubramanian, Appl. Phys. Lett. vol. 70, No. 22, Jun. 2, 1997, pp. 2957-2959.

20% (AM1.5) Efficiency GaAs Solar Cells on Sub-mm Grain-Size Poly-Ge And Its Transition to Low-Cost Substrates, Rama Venkatasubramanian et al., 26th PVSC; Sep. 30-Oct. 3, 1997; Anaheim, CA, pp. 811-814.

Electronic and Mechanical Properties of Ge Films Grown on Glass Substrates, R.K. Ahrenkiel et al., 26th PVSC; Sep. 30-Oct. 3, 1997; Anaheim, CA, pp. 527-529.

MOCVD of $Bi_2Te_3$ and Their Superlattice Structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 No. 10 p. 152(2), pp. 1-3.

ONR Contributes to Thermoelectric Research (Office of Naval Research) (Brief Article), Ozone Depletion Network Online Today, Contact ONR, website http://www.onr.navy.mil.

In-Plane Thermoelectric Properties of Freestanding Si/Ge Superlattice Structures, Rama Venkatasubramanian et al., 17th International Conference on Thermoelectrics (1998), pp. 191-197.

Potential of Si-based Suprlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian,[a)], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, HAO CUI,[1] I.B. BHAT,[1,3] and Rama Venkatasubramanian[2], 1.-Electrical, Computer and Systems Engineering Department, Rensselaer Polytechnic Institute, Troy, NY 12180-3590, USA. 2.-Research Triangle Institute, Research Triangle Park NC 27709, USA, 3.-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, website http://www.rti.org/units/es.cfm, pp. 1-2.

Nature Publishing Group, Materials Update, Cool Future for Semiconductors, Oct. 11, 2001, pp. 1-3.

Cool New Film, Science Update, Oct. 11, 2001, http://www.nature.com/nsu/011011/011011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagaziine.com/CDA/ArticleInformation/features/BNP_Features_Item/0.260 . . . Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea . . . , Jun. 20, 2002, pp. 1-3.

S. Fields, Proteomics in Genomeland, Science vol. 291 No. 5507pp. 1221-1224, pp. 1-7.

Samuel K. Moore, Making Chips, IEEE Spectrum, Biotechnology, Mar. 2001, pp. 54-60.

J. Patrick Fitch, Bahrad Sokhansanj, IEEE, Genomic Engineering: Moving Beyond DNS Sequence to Function, Proceedings of the IEEE, vol. 88, No. 12, Dec. 2000, pp. 1949-1971.

Rudolf Hofmeister et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

An Inverted-Growth Approach To Development of an IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

IR-Mediated PCR http://faculty.virginia.edu/landers/Irframe.htm.

Supplementary Partial European Search Report, Application No. EP 02 72 5575 Apr. 4, 2006.

US 6,381,965, 05/2002, Ghoshal (withdrawn)

* cited by examiner

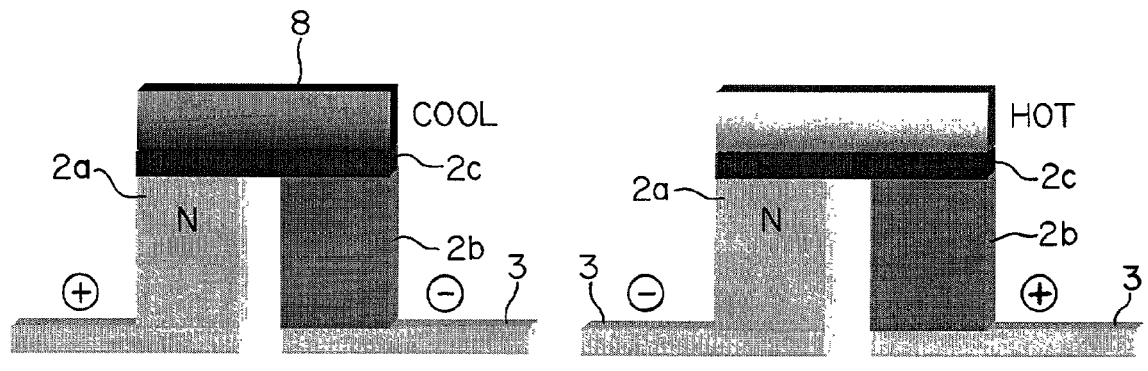
F I G . 1A    F I G . 1B
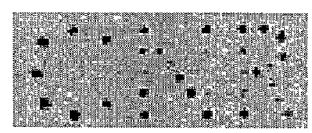
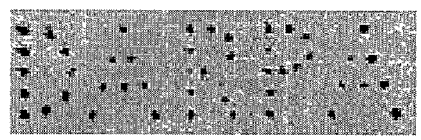
F I G . 2A

THIN-FILM THERMOELECTRIC COOLING AND HEATING DEVICES FOR DNA GENOMIC AND PROTEOMIC CHIPS, THERMO-OPTICAL SWITCHING CIRCUITS, AND IR TAGS

CROSS REFERENCE TO RELATED APPLICATIONS

This application claims priority under 35 U.S.C. §119 to U.S. Provisional Application No. 60/282,185 entitled Thin-film Thermoelectric Cooling and Heating Devices for DNA Genomic and Protemic Chips, Thermo-optical Switching Circuits, and IR Tags, filed Apr. 9, 2001, the entire contents of which are incorporated herein by reference. This application includes subject matter related to that disclosed in U.S. Pat. No. 6,071,351; and U.S. Ser. No. 09/381,963, filed Mar. 31, 1997, entitled Thin-film Thermoelectric Device and Fabrication Method of Same; and U.S. Provisional Application Ser. No. 60/190,924, filed March 2000, entitled Cascade Thermoelectric Cooler; and U.S. Ser. No. 60/253,743, filed Nov. 29, 2000, entitled Spontaneous Emission Enhanced Heat Transport Method and Structure for Cooling, Sensing, and Power Generation, the entire contents of which are incorporated herein by reference.

BACKGROUND OF THE INVENTION

1. Field of the Invention

The present invention relates to thin-film thermoelectric cooling and heating devices for application in a broad range of applications from DNA genomic and proteomic chips, thermo-optical switching circuits, and infrared tags, and to the application of anisotropic heat spreaders to electro-holographic optical switching, thermocapillary and bubble-jet optical switching, micro-strip delay lines for packet switching in cellular communication, and temperature control for probes in micro-surgery and bio-tissue analysis.

2. Description of the Background

Solid-state thermoelectric devices can improve the performance of electronic components, opto-electronic components and sensors. Today, thermoelectric devices based on bulk (~1 mm thick) p-$Bi_xSb_{2-x}Te_3$ and n-$Bi_2Te_{3-x}Se_x$ alloyed materials are used in cooling applications. FIG. 1A is a schematic of a bulk device consisting of two thermoelectric materials 2a, 2b having an appropriate bias voltage for cooling at a Peltier contact 2c. FIG. 1B shows that the same device can be used for heating at the Peltier contact with an appropriate opposite bias voltage. Bulk devices present a cold surface or a hot surface existing across the entire top surface of the thermoelectric device. So far, bulk thermoelectric devices have not been made to selectively heat or cool local regions without heating or cooling adjacent areas because of their relatively large size (of each element) as well as lack of microelectronic type processing. As such, thermoelectric devices have not been employed in applications requiring selective heating or cooling.

SUMMARY OF THE INVENTION

One object of this invention is to provide thin-film thermoelectric devices that can cool or heat with response times of tens of μsec instead of hundreds of msec for bulk devices, and another object of the invention is to cool or heat extremely small areas, tens to hundred $\mu m^2$, as compared to the $mm^2$ areas of bulk thermoelectric devices, are locally heated or cooled.

Accordingly, one object of the present invention is to provide spot-cooling and spot-heating at localized areas defined by the pattern of thin-film thermoelectric devices and the applied electrical bias.

Another object of the present invention is to provide the spot heating and/or cooling on the same side of a thermoelectric device.

Still another object of the present invention is to provide rapid heating or cooling to selective surface components.

Another object of the present invention is to provide a thin-film thermoelectric device which can self-assemble DNA material for genomic and proteomic applications in a microarray format.

Another object of the present invention is to control reaction chemistry, through temperature control of reaction rates, between molecules such as between DNA or between DNA and RNA or between protein molecules or between enzyme and reactants or in general between any two or more molecules in an array format such as for example DNA-RNA, RNA-RNA, DNA-RNA, protein-DNA, protein-RNA, protein-ligand, and enzyme-substrate.

A further object of the present invention is to provide a thermoelectric device which can, via thermo-optical components, control optical switches in optical networks.

Another object of the present invention is to provide a thermoelectric device which can control the lasing frequency of a laser via temperature-derived bandgap changes in the laser material.

Still another object of the present invention is to provide a thermoelectric device which can perform spot cooling/heating to produce infrared images for identity tags.

These and other objects of the present invention are achieved by providing a thermoelectric cooling and heating device including a substrate, a plurality of thermoelectric elements arranged on one side of the substrate and configured to perform at least one of selective heating and cooling such that each thermoelectric element includes a thermoelectric material, a Peltier contact contacting the thermoelectric material and forming under electrical current flow at least one of a heated junction and a cooled junction, and electrodes configured to provide current through the thermoelectric material and the Peltier contact. As such, the thermoelectric cooling and heating device selectively biases each individual thermoelectric element to provide on one side of the thermolectric device a grid of localized heated or cooled junctions.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee. A more complete appreciation of the present invention and many attendant advantages thereof will be readily obtained as the same becomes better understood by reference to the following detailed description when considered in connection with the accompanying drawings, wherein:

FIG. 1A is a schematic illustration of a bulk thermoelectric device with a bias voltage for cooling a Peltier contact;

FIG. 1B is a schematic illustration of a bulk thermoelectric device with an opposite bias voltage for heating a Peltier contact;

FIG. 2A is an illustration of a spot cooled image in the form of "ONR" and "DARPA" as shown by the IR image, see temperature scale for reference;

DESCRIPTION OF THE EMBODIMENTS

Figure 2B:
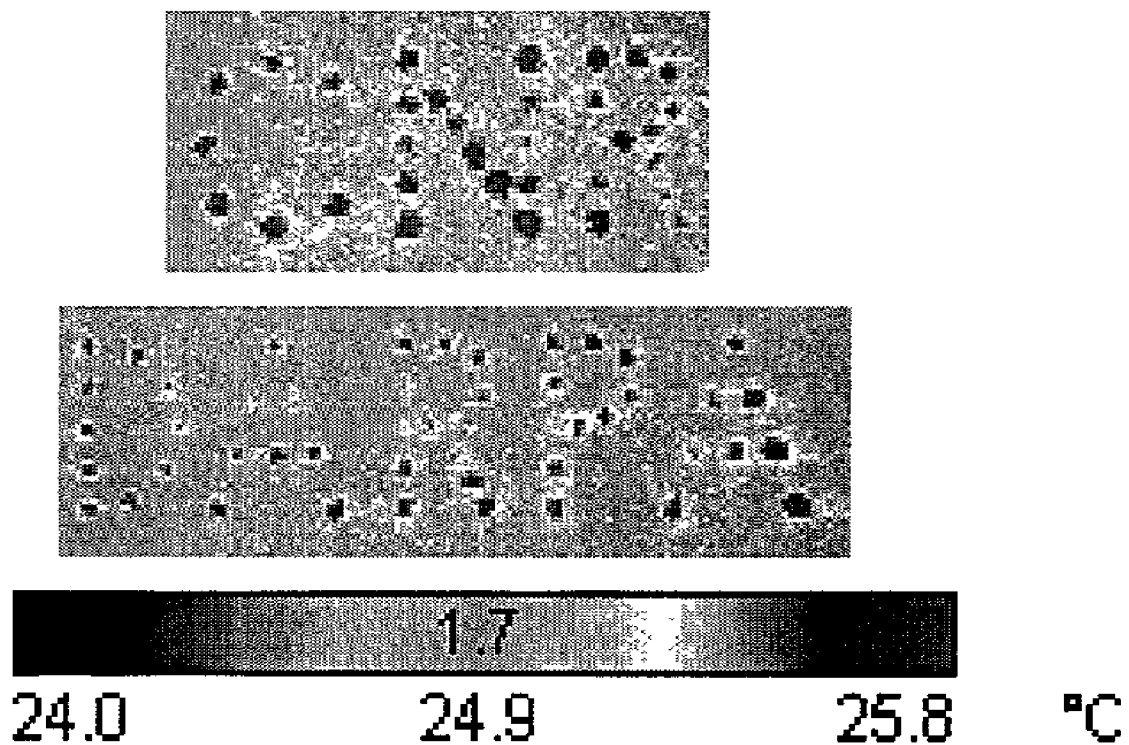
FIG. 2B is another illustration of a spot heated image in the form of "ONR" and "DARPA" as shown by the IR image; see temperature scale for reference.

Referring now to the drawings, wherein like reference numerals designate identical, or corresponding parts throughout the several views, and more particularly to FIG. 2A thereof, FIG. 2A is an illustration of a spot cooled image in the form of "ONR" and "DARPA" as shown by an IR image feature produced by cooling of the present thermoelectric devices. In such cooling, microelectronic lithography is employed to pattern micro thermoelements arbitrarily across the surface of a substrate. The second illustration in FIG. 2B shows an infra-red image generated by spot heating in a thermoelectronic device of the present invention. The ability to obtain spot cooling or heating with thin-film thermoelements is enabled by the very low-resistivity specific contact resistivities leading to relatively high device (which includes the effect of contact resistance and that of the material) figure-of-merit (ZT>0.1 at 300K) which can be obtained with the thin-film thermoelements. By reversal of the bias voltage to the thermoelements, the spots can be made to heat as shown by the image of heated spots in FIG. 2B. Based on the results in FIGS. 2A and 2B, the device modules shown in FIGS. 3 and 4 can both arbitrarily cool and heat local surface spots.

Figure 3:
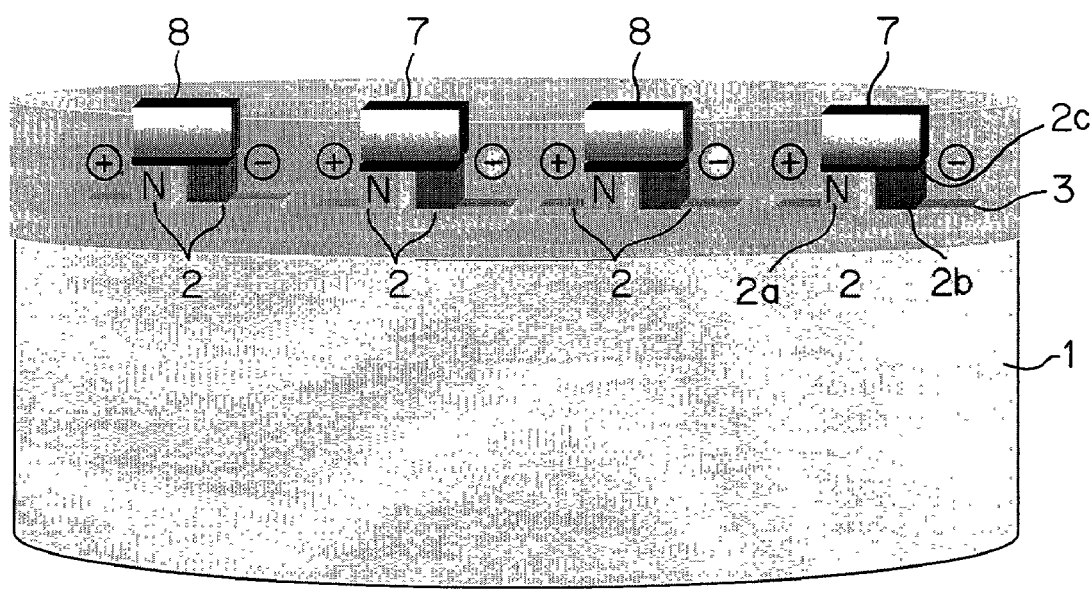
FIG. 3 is a schematic illustration of integrated spot-coolers for local-area cooling or heating.

FIG. 3 is a schematic of integrated spot-coolers for local-area cooling or heating. In FIG. 3, several thin-film thermoelectric elements are placed in parallel and heat or cool a particular area depending on the direction of current flow in these elements. As shown in FIG. 3, the thermoelectric cooling and heating device of the present invention includes a substrate 1 and a plurality of thermoelectric elements 2 arranged on the substrate 1 with each thermoelectric element 2 having an n-type thermoelectric material 2a, a p-type thermoelectric material 2b located adjacent to the n-type thermoelectric material 2a, a Peltier contact 2c connecting the n-type thermoelectric material 2a to the p-type thermoelectric material 2b. Electrodes 3 contact both a side of the n-type thermoelectric material 2a opposite the Peltier contact 2c and a side of the p-type thermoelectric material 2b opposite the Peltier contact 2c. Appropriately biased electrical current flow through selected ones of the thermoelectric elements 2 makes the Peltier contact 2c either a heated junction 7 or a cooled junction 8. Further, the thermoelectric cooling and heating device of the present invention includes a controller connected to the electrodes and configured to selectively bias the electrodes of each of the thermoelectric elements in an appropriate direction to form the cooled junction or an opposite direction to form the heated junction. As shown in FIG. 3, the thermoelectric elements 2 are patterned onto the substrate 1. This pattern can frequently be a grid pattern, but many other patterns designed to interface the thermoelectric cooling and heating device of the present invention to specific applications are possible.

According to the present invention, a wiring grid can individually connect to each of the thermoelectric elements providing the controller access to each thermoelectric element for application of an appropriate bias for cooling or an opposite bias for heating. One side of all the thermoelectric elements can, according to the present invention be connected to a common ground. Similar grid wiring connections and control are utilized in liquid crystal display grids as described in U.S. Pat. No. 6,154,266, the entire contents of which are incorporated herein by reference. However, the grids may alternatively be connected or segmented in pre-designated sets (e.g. columns and rows) which are commonly connected to have the same polarity of voltage simultaneously applied, enabling the pre-designated sets to be block-addressed by the controller.

Contrary to FIG. 3, in one embodiment of the present invention, only one leg of the thermoelectric element is required to produce heating or cooling. In this embodiment, a selected type of thermoelectric material (i.e. n-type or p-type) is utilized with the Peltier contact 2c. Current flow in a first direction through an electrode, a thermoelectric material, the Peltier contact 2c, and a subsequent electrode results in a heated junction at the Peltier contact 2c. A current flow in a second direction opposite to the first produces a cooled junction at the Peltier contact 2c. Indeed, the spot cooled images in FIGS. 2A and 2B were produced utilizing current flow through an electrode, a thermoelectric material, a Peltier contact, and a subsequent electrode.

Figure 4:
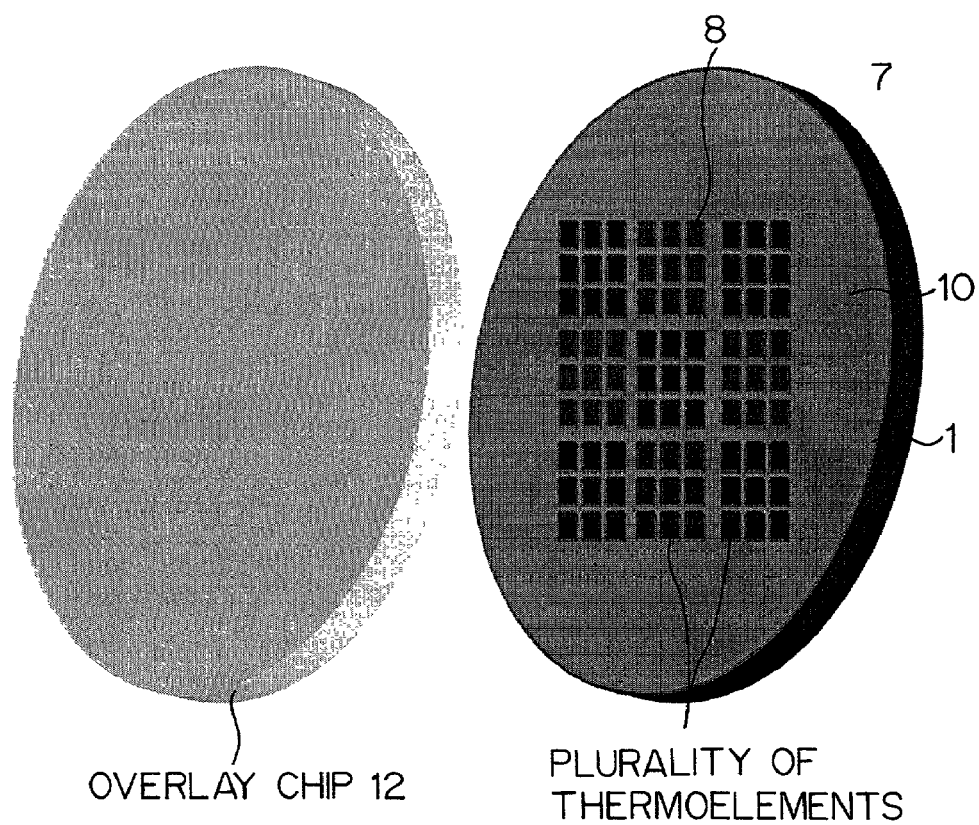
FIG. 4 is an illustration of a combined spot cooling and spot heating of a surface of a low thermal conductivity material header.

FIG. 4 is an illustration of a combined spot cooling and spot heating of a surface header 10 made of a low thermal conductivity material. Shown in FIG. 4 is an overlay chip 12 which mates to the surface header. The ability to both spot-cool and spot-heat on the same side of the thermoelectric device of the present invention permits flexibility in the application of thermoelectric thin-film devices to temperature dependent process control. In some applications, utilization of a thermally insulating material (e.g. a low-thermal conductivity material like glass or quartz rather than a high-thermal conductivity material like AlN) for the heat-source header is not necessary to preserve the pattern of cooled or heated spots.

The thin film thermoelectronic devices of the present invention, according to one embodiment of the present invention, are thermally coupled to a surface header 10 which is an anisotropic heat spreader in which the thermal conductivity is excellent in a direction normal to the surface header (i.e. the direction of heat flow from a point which needs to be cooled or heated to the Peltier contact region of the device) while the lateral thermal conductivity in the plane of the surface header (i.e. in a direction across the surface header 10) is low. In this embodiment, the anisotropic heat spreader includes a composite of a high thermal conductivity material (e.g., oriented crystals in a polycrystalline matrix or a high thermal conductivity rods (e.g., silicon rods or copper rods) in a low-thermal conductivity matrix (e.g., glass). The composite, according to the present invention, provides high thermal conductivity perpendicular to a plane of the surface header 10 and low thermal conductivity parallel to the plane of the surface header 10, thus preserving the spot-cooling/heating character of the thin film thermoelectric devices of the present invention. Furthermore, the anisotropic heat spreaders, according to the present invention, can utilize other forms of heat spreaders such as graphite or metal fibers in an aerogel matrix to achieve high thermal conductivity perpendicular to the plane of the header compared to low thermal conductivity in the plane of the header.

Figure 5:
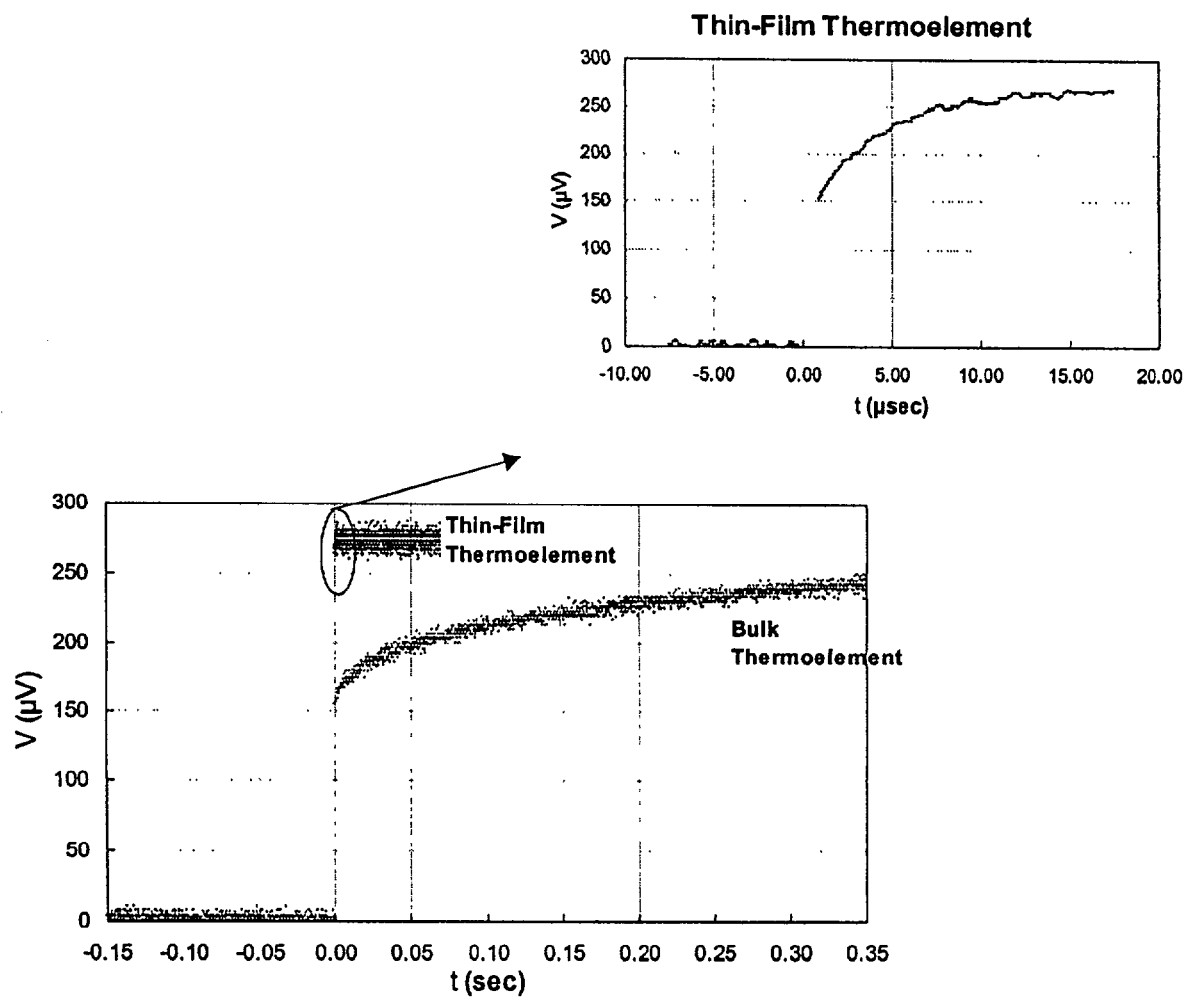
FIG. 5 depicts graphs illustrating the time responses of a 5 μm thin-film thermoelement as compared to a bulk (1 mm) thermoelement.

One advantage of the 1 to 10 μm thin-film thermoelectric devices of the present invention is that the spot cooling and/or spot heating is extremely fast. FIG. 5 illustrates the time-response of a 5 μm thick thermoelectric device and a time response of a typical state-of-the-art bulk (1 mm-thick) element after currents which produce cooling are applied to these devices. As shown in FIG. 5, the thin film thermoelectric device of the present invention responds within 15 μs while the bulk thermoelectric device responds within 0.40 s. Thus, the thin-film thermoelectric devices of the present invention have a time constant on the order of a few microseconds, while the bulk thermoelectric devices have a time constant of hundreds of milliseconds. The time constant difference arise directly from the fact that the thermal response time ($\tau_r$) is significantly smaller in thinner thermoelements. The $\tau_r$ is approximately given by equation (1):

$$\tau_r = 4L^2/l^2 D \quad (1)$$

where L is thickness of the thermoelectric device and D is the thermal diffusivity. Thus, the thin-film thermoelectric devices of the present invention have a fast response time allowing for rapid changes to surface temperatures and hence rapid control of chemical, physical, mechanical, or optical phenomenon associate with these surface temperature changes. L for bulk thermoelectronic devices ranges from 500 to 2000 microns in bulk while D ranges from 0.01 to 0.03 cm²/sec. In contrast, L for thin-film devices ranges 1 to 10 microns while D in $Bi_2Te_3$ superlattice thin-film materials is from 0.001 to 0.003 cm²/sec and D in Si/Ge thin-film materials is from 0.01 to 0.05 cm²/sec. Higher speed cooling/heating applications which require higher D and reasonable ZT is needed to obtain cooling. For small temperature excursions, a low ZT can be sufficient. Thus, according to the present invention, higher speed may be achievable with higher D materials such as for example InSb and their alloys and PbTe and their alloys.

Further, the performance of any thermoelectric device is dependent on the figure-of-merit (ZT) of the thermoelectric materials used to fabricate the device. The cooling or heating of the present invention can utilize high-performance high-ZT $Bi_2Te_3$-based superlattice structured thin-film materials to obtain enhanced performance levels, as described in U.S. patent application Ser. No. 09/381,963, the contents of which have been incorporated herein by reference. Alternatively, non-superlattice structured thermoelectric materials can be used in the present invention. In general, the present invention is not limited to any particular design, material, or fabrication process of a bulk or thin film thermoelectric device.

Specific applications which can take advantage of the above described developments in small area/fast response time thin-film thermoelectric devices include but are not limited to applications in DNA array fabrication, DNA electrophoresis for genome sequencing, DNA functional genomics, and DNA proteomics. Genomics and protemics research have been described in *Proteomics in Genomeland*, in Science, vol. 291, No. 5507, pp. 1221–1224, the entire contents of which are incorporated herein by reference. In addition, the thermoelectric devices of the present invention can be used for electro-thermal optical switching for high-speed optical communications and other selective-cooled optoelectronic applications. Further, the thermoelectric cooling devices of the present invention can be used as identification tags for military personnel, military systems, and even commercial systems. Identification tags utilizing the spot cooling or heating of the present invention can be scanned by IR-imaging devices.

Fabrication of conventional DNA chips (or microarrays) for electrophoresis or genomics or proteomics begins with glass silicon substrates. Onto these substrates are fixed or assembled thousands of patches of single-stranded DNA, referred to as probes. Each patch measures just tens of μm in lateral dimension. Microelectronic photolithographic techniques offer the best technique for obtaining the highest density of probes. Conventional production scale microarrays can have 400,000 probes in 20-micron size patches. Conventional procedures are described in *Making Chips*, in IEEE Spectrum, March 2001, pp. 54–60, the entire contents of which are incorporated herein by reference.

A first step in DNA analysis on a microarray fabrication is the separation of twisted strands of the DNA by unzipping the DNA along the rungs of the ladder, using temperature or biochemical methods. DNA consists of nucleotides stacked atop each other in two strands forming a twisted ladder. The twisted ladder has the sugar-phosphate support backbone. The rungs of the ladder are the bases. Adenine pairings occur with thymine, and guanine pairings occur with cytosine.

Figure 6A:
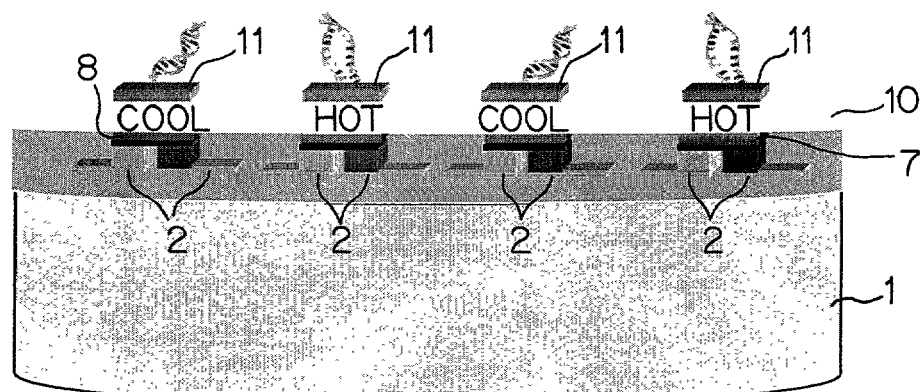
FIGS. 6A–6D are schematic illustrations of a single-strand of DNA produced by selective electro-thermal spot-temperature control using the thin-film thermoelectric devices of the present invention.
Figure 6B:
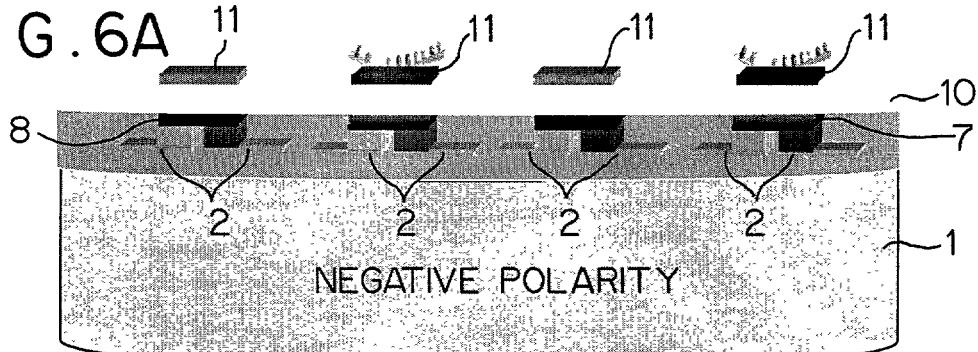
Figure 6C:
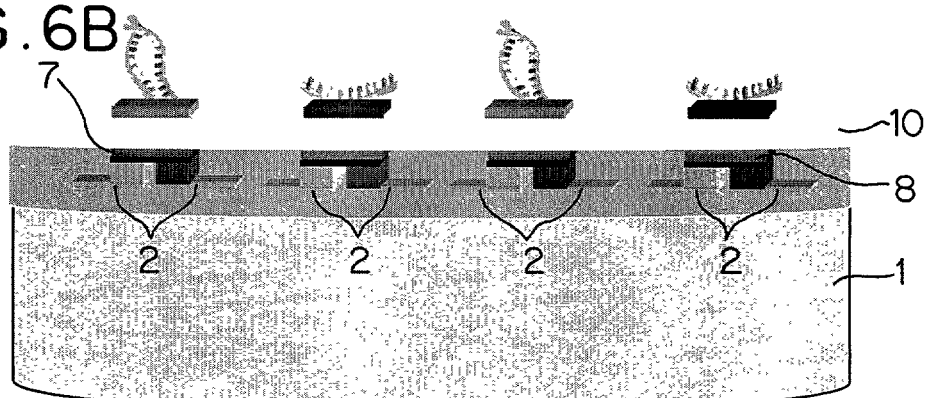
Figure 6D:
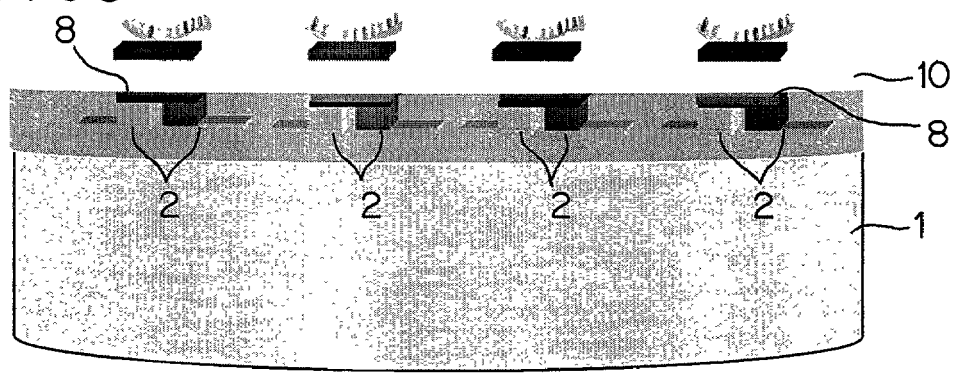

According to the present invention, the formation of single unzipped strands of DNA molecules occurs using a spot-cooling/heating electro-thermal chip as shown in FIG. 6A. In the spot-cooling/heating electro-thermal chip of the present invention, patches are patterned lithographically in a receptacle array to have dimensions ranging from 1 to 500 μm. FIGS. 6A–D show schematically the steps of forming a single-strand of DNA by selective electro-thermal spot-temperature control. A template 11 is attached to the surface header 10 where the DNA array is to be located. The DNA double helix will typically unzip at the "hot"points. However, certain DNA molecules, depending on their chemistry, may selectively unzip at "cold" points. The spot-cooling/heating of the electro-thermal chip of the present invention will heat or cool the DNA to predetermined temperatures to unzip the DNA strands, as shown in FIG. 6B. Once the DNA strands are unzipped at the respective "hot"or "cold" locations, the electro-thermal chip of the present invention can by charge control (using the fact that DNA molecules themselves carry charge) adhere DNA to predetermined areas on the surfaces of the electro-thermal chip. Alternatively, selective cooling can be utilized to enhance adsorption of a single strand of DNA to a specific site. Thus, the electro-thermal chip of the present invention produces single-strand generation and selective adsorption at predetermined locations. These steps, according to the present invention, can be followed by attachment and single-strand generation of another DNA molecule at adjacent locations, as shown in FIG. 6C. In FIG. 6D, the process of selective adsorption of various DNA molecules at the all desired sites is complete. Thus, once self-assembled, the DNA array is available for analytical characterizations such as for example mass spectroscopic analysis, NMR studies, x-ray analysis, etc.

Figure 7A:
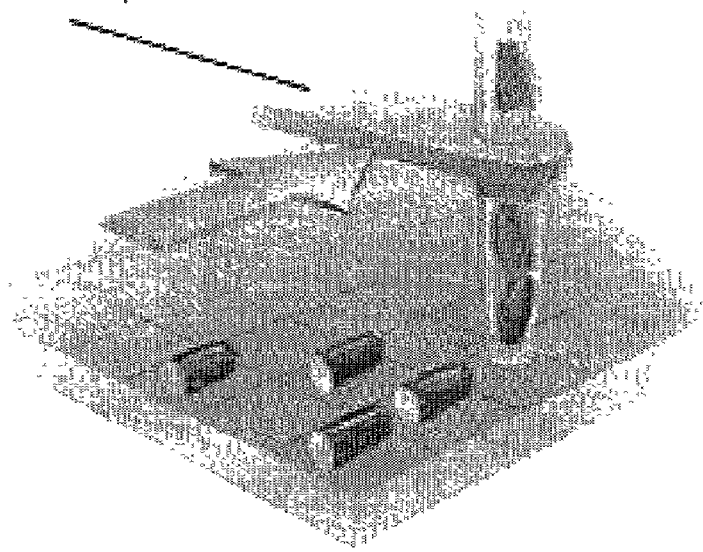
FIG. 7A is a schematic illustration of a robotic deposition process utilized to deposit DNA material.
Figure 7B:
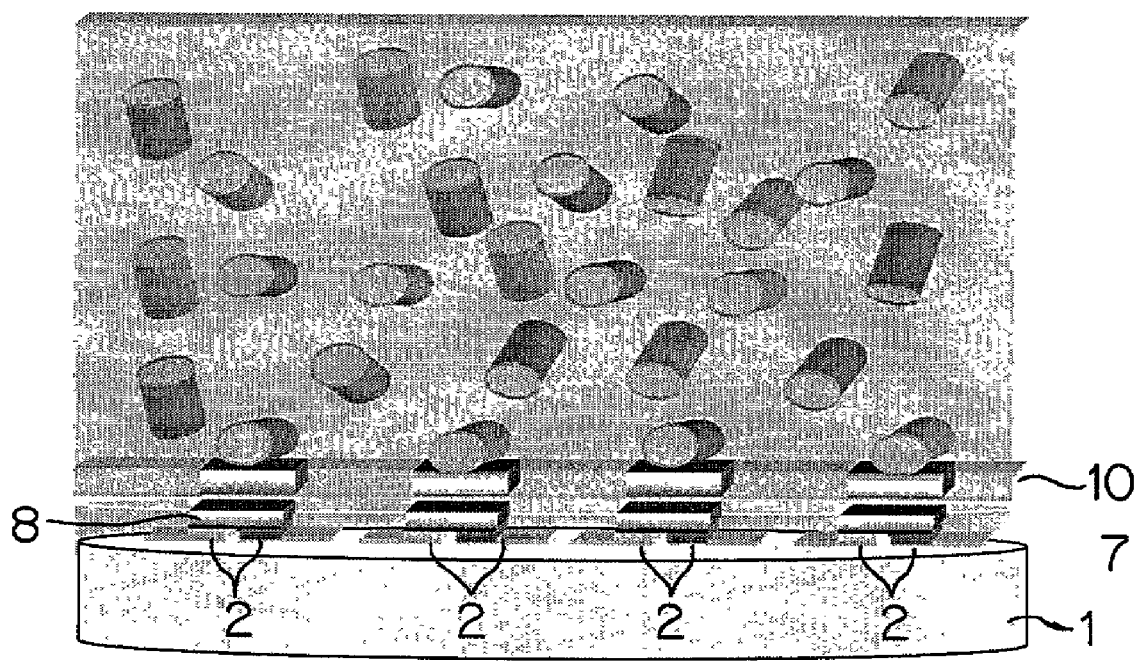
FIG. 7B is a schematic illustration of a self-assembly of DNA fragments or protein molecules obtained by selective temperature control using an electro-thermal genomic chip or electro-thermal proteomic chip of the present invention.

DNA microarrays numbering 100,000 to a million, with 20-micron size patches, can typically be deposited on glass or silicon substrates by robotic deposition as shown in FIG. 7A. However, robotic deposition is time consuming and costly. Conventional robotic deposition techniques have been described in U.S. Pat. No. 5,865,975, the entire contents of which are incorporated herein by reference. Instead, according to the present invention, by using a electro-thermal cooling/heating chip as shown in FIG. 7B, spot temperature control will self-assemble selective DNA or proteins. FIG. 7B is a schematic of a self-assembly of DNA fragments or protein molecules obtained by selective temperature control using an electro-thermal chip of the present invention. Thus, rapid fabrication of pre-determined DNA arrays for genomics or protein arrays for proteomic studies is realized by the self-assembling character of the biological material when deposited on the electro-thermal genomic or proteomic chips of the present invention.

Further, the spatially-controlled-temperature of the thin-film thermoelectric devices of the present invention can be utilized with existing DNA array fabrication methods. Today, DNA arrays are made either by inkjet printing or by in-situ fabrication. The inkjet printing process has been described in U.S. Pat. No. 6,180,351, the entire contents of which are incorporated herein by reference. In the inkjet printing process, droplets containing many copies of a sequence of DNA are deposited on a substrate. The thin-film thermoelectric device of the present invention permits spatial temperature control combined with rapid cooling/heating to promote adhesion or adsorption of the DNA strands. Furthermore, the in-situ fabrication of DNA sequences by the photolithography process, as described in U.S. Pat. No. 5,874,219, the entire contents of which are incorporated herein by reference, can be replaced by the selective adhesion of the DNA at the spot-temperature controlled areas on the thin-film thermoelectric device of the present invention. For example, the traditional in-situ fabrication of DNA sequence by deposition of one nucleotide at a time(shown in FIG. 7a.) can be replaced by thermal activation or cooling-enhanced adsorption on a spatially-controlled-temperature grid. Thus, the self-assembly method of the present invention avoids exposure of the DNA to UV light required in the traditional photolithographic process. UV exposure can cause unintentional chemical modification of the DNA. Further, replacing spot photo-chemistry with spot thermo-chemistry of the present invention has other advantages in that the DNA is preserved in tact without chemical modification, as can occur when the capping chemicals used in the traditional photolithographic DNA array process are applied.

Figure 9:
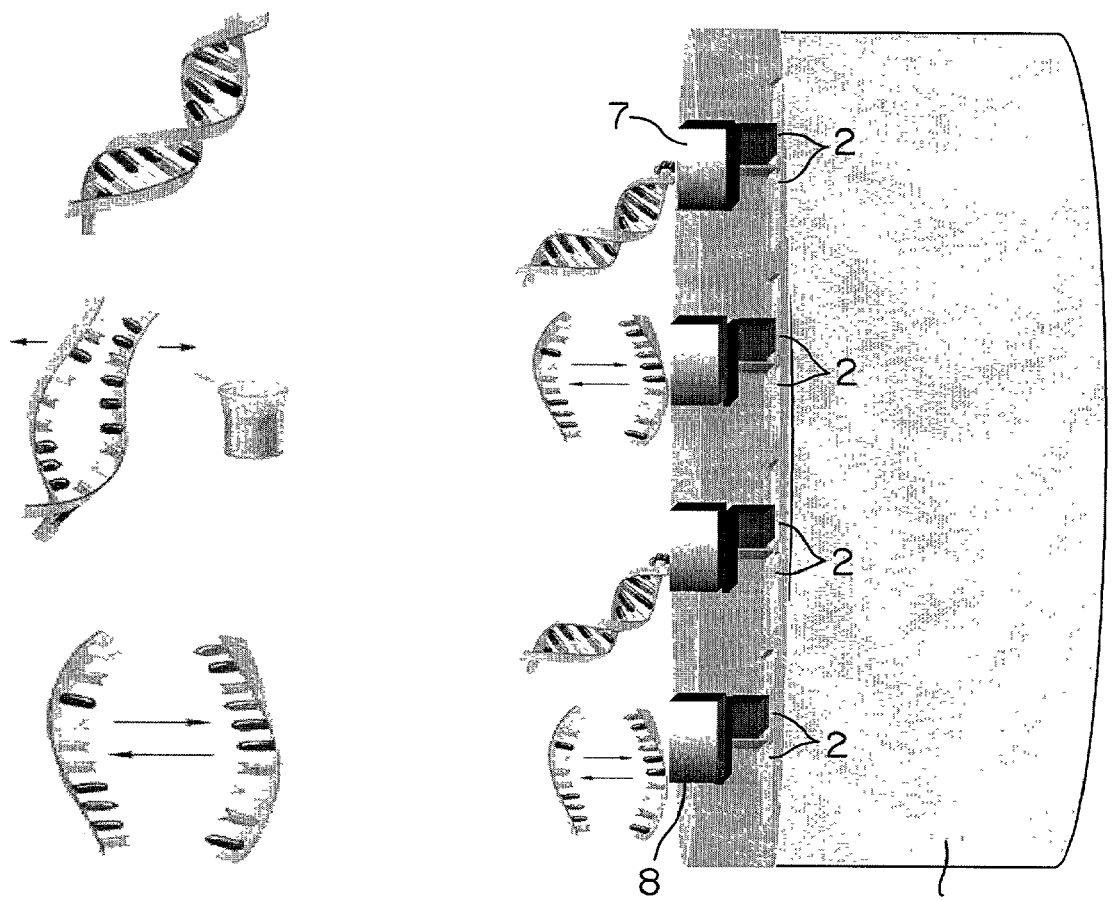
FIG. 9 is a schematic illustration of the attachment and unziping of double-helical strands and the introduction of new DNA strand to be hybridized, the strands being attached to an electro-thermal chip of the present invention illustrating spatial temperature control utilized for genomics and proteomics study.

In addition to spot temperature control, in another embodiment of the present invention, spot temperature control can be combined spot electric fields. For example, arrays of electrically active (−1.3 to 22.0 Volts) pads can, according to the present invention, control the pooling of DNA onto particular sites. Pooling of DNA onto electrically charged sites speeds the hybridization reaction of the DNA by a factor of as much as 1000. Hybridization represent the pairing of individual genetic species which belong to genetically different species. For example, complementary RNA and DNA strands can be paired to make a RNA-DNA hybrid which forms a "new" double-strand from genetically different sources. FIG. 9A is a schematic illustration of DNA strands each containing a double helix, separation of the strands, and the introduction of new DNA strand to be hybridized. FIG. 9B is a schematic illustration of an electro-thermal chip of the present invention which depicts spatial temperature control utilized for genomics and proteomics study. Formation of new pairs can be assisted in the present invention by cooling weakly hybridized pairs to inhibit the strands from prematurely breaking apart before hybridization. Furthermore, excessive temperatures can result in a hybridized pair dehybridizing, defeating the engineering process.

Thus, the process of selective adsorption, single-strand generation, and hybridization as directed by the thin-film thermoelectric devices of the present invention is accomplished by decreasing the temperature at selected sites to facilitate charge-bonding or electrovalent bonding of a first set of DNA strands to lysine which pre-existed on a template of the selected sites, exposing the charge-bonded or the electrovalent-bonded DNA strands to UV light to cross-link the lysine and the DNA strands, heating the selected sites to unravel the first set of DNA strands whereby one strand is no longer attached, introducing a second set of DNA strands, and hybridizing the second set of DNA strands to the attached single stranded DNA of the first set.

Further, the present invention provides a tool by which chemical kinetic processes of DNA cell systems can be studied to observe reaction rates affected not only by temperature but also by other physical and chemical parameters. Currently, genomic data is static: sequence and structure. Dynamic information in the form of enzymology experiments, which measure reaction kinetics in DNA microchips and arrays, would yield valuable information. The reaction kinetics studied in conventional DNA microarrays suggest that study of faster chemical reaction times through spatial temperature control can lead to a better understanding and could eventually permit manipulation and control of DNA reaction kinetics. Genomic engineers need to reduce the experimental iterations to better understand the DNA structure and need faster analysis when introducing deliberate changes to the functional genomics. Control of the DNA structure will profoundly influence the speed and ability to safely engineer new crops, medicines, and genetic treatments. According to the present invention, the thermoelectric elements can act as localized thermo-genetic switches to switch (i.e. temperature activate) DNA chemistry, DNA- RNA chemistry, protein synthesis, enzyme-aiding conversion of dominant genes to recessive genes and vice-versa, and production of medical antibodies.

Furthermore, interpreting data from DNA micro-arrays has emerged as a major difficulty. An array is a technology that provides massively parallel molecular genetic information. Biostatistics and bioinformatics which truncate the data defeat the whole purpose of array sampling. Usually, the data in such arrays are interpreted by finding a logical link between the expression of a gene and its function. Since biological and chemical processes are controlled by temperature, temperature control in micro-arrays as enabled by the present invention will act as a control lever. Raising the temperature will accelerate reactions; lowering the temperature will retard reactions. Statistically Manageable Areal Rapid Temperature-control DNA arrays or SMART DNA arrays can be developed using the thermoelectronic devices of the present invention to aid in data interpretation, particularly the finding of functional links.

Advantages of the spot-cooling/heating method of the present invention include (1) high-speed inkjet printing of DNA micro-arrays using spatial temperature-controlled thin-film thermoelectric devices to assist self-assembly, (2) replacement or augmentation of photolith-based DNA micro-arrays with thermochemistry using the spatial temperature-controlled to form the array of DNA, (3) rapid thermal cycling for DNA sequencing, and (4) DNA sequencing for high throughput process for determining the ordered base pairs in DNA strands.

Figure 8:
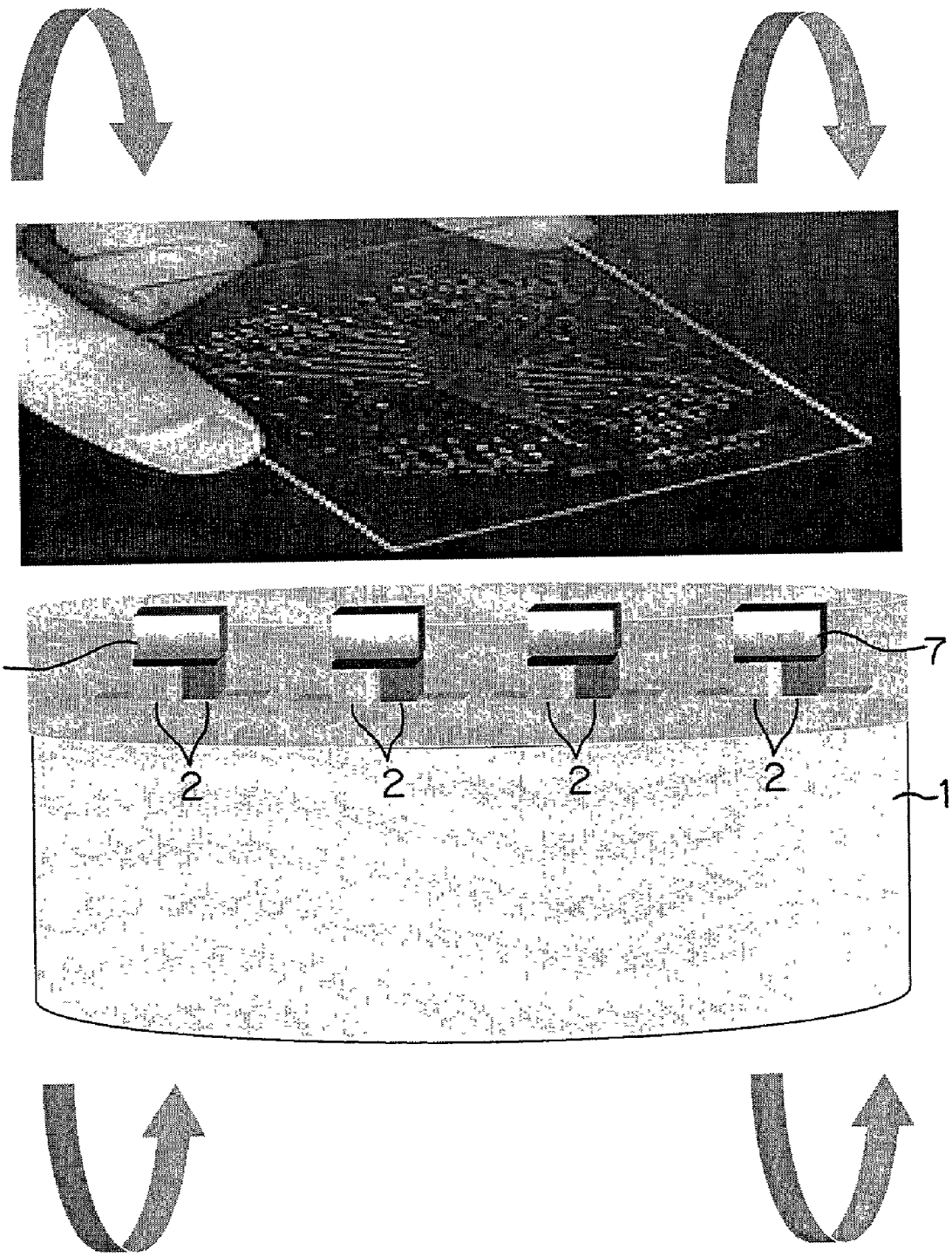
FIG. 8 is an illustration of a spatially-controlled electro-thermal electrophoretic DNA chip.

Another embodiment of the present invention, a spatially-controlled-temperature electro-thermal electrophoretic chip, as shown in FIG. 8. For clarity, only a few cooling and heating spots are shown in FIG. 8. Yet, a large number of electrophoretic array spots exist in the electrophoretic chip. Spot sizes of the present invention ranging from 5 µm×5 µm to 1000 µm×1000 µm, resulting in spot densities ranging from 100 to a million or more spots per $cm^2$. The electro-thermal electrophoretic chip of the present invention cools hot spots generated during electrophoresis of DNA. For example, the heat generated during electrophoresis can approach 30 to 100 $W/cm^2$. Removal of such high heat fluxes can be easily achieved with microelectronically processed thin-film thermoelectric devices (see for example U.S. patent application Ser. No. 09/381,963). Further, in electrophoresis, the ability to individually cool or heat in a controlled 20 µm×20 µm patch or other similar geometries provides a tool to understand, modify, and control DNA electrophoresis. In addition, charge control can be augmented to provide selective adsorption at precharged sites.

The method of choice for DNA sequencing to determining a size of a DNA strands is a four-color electrophoresis utilizing fluorescent labeling specific to the bases in the DNA. There are several sources of noise in such analysis such as surplus DNA without attached fluorescent labels, single-stranded DNA folding on itself, etc. These noise sources are reduced using purification of samples before loading, engineering of gel and buffer chemistries and optimization of temperature, all leading to better resolution. The spatially-controlled-temperature electro-thermal electrophoretic chip can potentially solve several of these problems leading to faster and reliable DNA sequencing. For example, it is known that if the temperature is sub-optimal, the folding of the single strand of DNA can change the electropherogram. Thus, by using the spatially-controlled-temperature electro-thermal electrophoretic chip of the present invention, in one process step, the optimal temperature range can be obtained leading to faster DNA sequencing.

Another embodiment of the present invention is a spatially-controlled-temperature electro-thermal chip for self-assembly of biological material. Today, DNA microarrays or biological chips are made as follows. Using polymerase chain reaction or biochemical synthesis, strands of DNA are separated. Photolithography techniques are used to convert glass, plastic, or silicon substrates into a receptacle array for DNA strands. Electrophoretic bonding or robotic deposition or tiny droplet sprayers are used to adhere the genetic material to the substrate. With the present invention, the receptacle array is thermally coupled to a spot-cooling/heating thin-film thermoelectric module to realize the electro-thermal chip of the present invention. DNA strands can be self-assembled by the spot-temperature control process illustrated in FIGS. 6 and 7. The spot-cooling/heating thin-film thermoelectric module in the electro-thermal chip is reusable from receptacle to receptacle. Thus, the electro-thermal chip of the present invention permits rapid self-assembly of DNA arrays and reduces the cost of fabrication of DNA chips by avoiding robotic or photolithographic DNA transfer techniques. The electro-thermal chip of the present invention cools or heats very small areas, such as 20 µm×20 µm spots as in the DNA patches of a modem microarray. Thus, each of the 20 µm×20 µm patches or other similar geometries, if individually cooled or heated in a controlled manner, provides a tool to understand, modify, and control DNA genomics.

Figure 10:
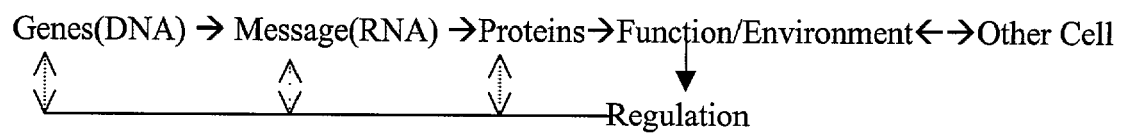
FIG. 10 is a flow chart illustrating multiple feedback processes between DNA, RNA, and proteins.

Proteins are chains of amino acids assembled in an order specified by the sequence of DNA bases located in the chromosomes in the cell nucleus. RNA molecules move messages from the nucleus to ribosomes that assemble proteins by matching three-base sets (codons) in message-RNA with complementary codons on transfer RNA attached to individual amino acids. This orderly sequence relates the "expression" of gene to "activity" of protein in the cell. However, this relation is very complicated with multiple feedback loops as shown in FIG. 10.

As a result of the modifications from regulations and feedback, some complex human genes can produce hundreds of different proteins. Tools are needed to do a high-throughput study of the non-genome (feedbacks) interactions shown in FIG. 10. Unlike genomics, there is no microarray for measuring the concentration of many proteins simultaneously. Today, the only way is to separate different proteins is by mass, since different amino acids sequences correspond to different masses. The present invention utilizes 2-D gel electrophoresis which is similar to the electrophoresis used in DNA sequencing such that disclosed in Fitch and Sokhansanj, Proc. of IEEE, December 2000, the entire contents of which are incorporated herein by reference. An electric field is applied along one axis to get a 2-D spot representing the concentration of a particular protein in the sample. Spot-cooling or spot-heating in a two-dimensional array, utilizing the electro-thermal chip of the present invention, offers a new approach to the study of proteomic chips. Further, electric field variations can be combined with temperature variations to manipulate the protein formation in simulation of real conditions.

For example, the temperature variations in the electro-thermal chips can be used as a genetic switch to control or regulate the pathway of genes in how they synthesize proteins. The fast response time/small area control in a electro-thermal chip will provide a control system to produce useful proteins in an orderly fashion. Thus the fast response time/small area control, in combination with the electric field control, afforded by the electro-thermal chip of the present invention can lead to the implementation of stable regulatory pathways for protein synthesis from gene expressions. Further, synthesis, characterization, and manipulation of heat shock proteins (and the related DNA) in a micro-array utilizing the electro-thermal chip of the present invention, is enabled by the ability to rapidly change the temperature. There are about 23 genes, out of a total of about 1367 typically concerned with human toxicology, that are classified as specific to heat shock proteins.

Temperature selection using spatially-temperature-controlled electro-thermal chips can be used to control either the production of mRNA, the transport of mRNA and the translation of mRNA to protein, all leading to new applications in new crops, medicines, and genetic treatments. For example, the reaction rate constants that control the binding of RNA polymerase with DNA can be controlled with temperature so that the effects of repressors can be overcome and so new proteins (enzymes) can be generated. Similarly, temperature can be controlled to provide a sharp burst of mRNA to generate proteins.

Thus, a further embodiment of the present invention is a spatially-controlled-temperature electro-thermal chip for proteomic studies. As previously noted, the electro-thermal chip of the present invention cools or heats very small areas, such as 20 μm×20 μm spots as in the DNA protein patches of a modern microarray. Thus, each of these 20 μm×20 μm patches and other similar geometries, if individually cooled or heated in a controlled manner, will provide a tool to understand, modify, and control proteomics.

The effect of temperature control on DNA analysis, DNA amplification, protein synthesis, and DNA chemistry has been unstudied in DNA microarrays mainly because of the lack of suitable chip technologies. There are some studies that indicate that temperature may have significant importance in DNA analysis, DNA amplification, and general DNA and protein chemistry. For example, in the DNA study of *Yersinia pestis,* the virulence mechanism of *Yersinia.pestis* become active at 37 C. J. P. Fitch and B. Sokhansanj, in Proc. of IEEE, Vol. 88, No. 12, pp. 1949–1971, (2000), the entire contents of which are incorporated herein by reference, have shown that some *Yersinia pestis* genes are expressed more at 37° C. than 25° C. while others are expressed more at 25° C. than at 37° C. Temperature control studies can be accomplished in one step using a spatially-temperature-controlled electro-thermal chip of the present invention. Rapid heating of small volumes using IR radiation has been utilized in DNA amplification in polymerase chain reaction (PCR), see for example IR-Mediated PCR, http://faculty.virginia.edullanders/project.htm, the entire contents of which are incorporated herein by reference. IR-mediated heating has also been studied in enzyme assays.

Thus, in another embodiment of the present invention, an electro-thermal PCR chip of the present invention is utilized to locally heat or cool DNA sample. The electro-thermal PCR chip can control the temperature more locally than techniques which rely on volumetric heating techniques, e.g. IR radiant heating. In one embodiment of the present invention, the electro-thermal PCR chip replaces photochemistry with localized thermochemistry.

As previously noted, some Yersinia pestis genes were expressed more at 37° C. than 25° C. while other genes expressed more at 25° C. than at 37° C. A gene is expressed when the gene acts as a site to make a distinctive protein, leading to a biological activity like virulence. DNA microarrays have been powerful templates for understanding patterns of gene expressions. Similarly, the strength of a gene's expression depends on how much of the distinctive proteins are made. Thus, weak genes may be transformed into strong genes, by local thermochemistry control. Temperature control for gene expression studies can be easily accomplished in one step using the spatially-temperature-controlled electro-thermal genomic hip of the present invention.

Along the same lines, it may be possible to convert with temperature control native genes of an individual that would normally not be able to fight certain bacterial infections to genes which can be chemically alert, thus resistant to bacterial infections. Once the converted gene has been expressed, the subsequent antibodies, i.e. the byproducts of the electro-thermal chip, can be "safely" transferred to the individual.

While conventional DNA microarrays are relatively easy to fabricate, a significant problem with many DNA array experiments is that the hybridization is not perfect. This in turn necessitates redundancy and thus reduces speed. Spatial temperature control utilizing electro-thermal genomic chip represents an expedient way to find optimal temperatures to achieve improved hybridization. According to the present invention, electro-thermal heating/cooling can be integrated with microchips to perform PCR on substrates such as glass which normally inhibit hybridization reactions. The fast response times associated with the present thin-film thermoelectric devices are advantageous for rapid and effective thermocycling of PCR mixtures.

The electro-thermal electrophoretic chip, electro-thermal PCR chip, and the electro-thermal chip of the present invention are compatible with the low-thermal conductivity silica, glass sides or nylon membranes. As electrical insulators, these materials integrate spot temperature control and electrical charge control.

Also, the production of high-quality protein crystals necessary for detailed characterization has been difficult. Spatially-temperature-controlled electro-thermal proteomic chips of the present invention can be used to crystallize protein crystals by optimizing the temperature. A single chemistry process sequence, with spatially varying temperatures, can produce a whole range of crystals which in turn can be characterized. Structural genomics is an effort to do high-throughput identification of the 3-D protein structures corresponding to every gene in the genome. There are two experimental methods for determining 3-D protein structure: NMR and X-ray diffraction. NMR measures the coupling of atoms across chemical bonds and short distances through space under the influence of a magnetic field. A variable temperature NMR analysis, of the same protein, located at various points of a spatially-resolved electro-thermal chip of the present invention can offer new insights into structural identification. Similarly, variable temperature X-ray crystallography of the same protein can be done to understand structures of various protein crystals.

In a further embodiment of the present invention, the thermoelectric devices of the present invention are utilized in electrophoresis applications in an array format for single-stranded conformation polymorphism (SSCP) detection. Mass spectroscopy studies of DNA sequence polymorphisms as well as PCR processes have been described in U.S. Pat. No. 5,869,242, the entire contents of which are incorporated herein by reference. Additionally, it has been found that temperature control is particularly crucial in applications such as SSCP where precise temperature selection allow detection of mutations which are apparent only at specific temperatures. Typically these temperatures can range from near 0 to 80° C., with 1° C. control. By thermally coupling the thermoelectric devices of the present invention to the SSCP array, precise temperature control is achieved.

In another embodiment of the present invention, the thermoelectric devices of the present invention are utilized for precise temperature control in probes and prosthetics used for micro-surgery and bio-tissues. Rapid and spot temperature control, both in heating or cooling mode, is particularly useful in medical applications such as in micro-surgery involving bio-tissues as in brain tissues. Spot temperature control, especially in the cooling mode without a lot of heat dissipation, using the high-performance thermoelectric devices of the present invention would control the temperatures of bio-tissues on a chronic basis for providing relief against variety of ailments such as for example, epilepsy seizures from certain regions of the brain. According to the present invention, high-performance thermoelectric devices based on high-performance materials, such as superlattices, leads to longer battery life in such chronic applications and reduced parasitic heat dissipation in nearby tissues.

Besides biological applications, in another embodiment of the present invention, the fast response time/small area thin-film thermoelectric devices can be used for electro-thermal optical switching for high-speed, high-density optical communication networks as well as for a variety of selective (individual component controlled) cooling or heating in integrated optoelectronic transmitters/receivers.

For example, space-division optical switches are utilized in optical to make fiber-to-fiber interconnections. For large-scale optical networks, a planar technology for switching is preferred. Mechanical switches, employing mechanical moving elements such as micro-electro-mechanical-system (MEMS) mirrors or magnets, are not scaleable to large-scale M×N switches. In addition, repeatability, wear-and-tear and reproducibility of moving elements in MEMS mirrors as well as the requirement of high voltages (~50 Volts) for operation are undesirable features.

Waveguide space-division switches can realize large-scale N×N switches. Typically, the switching function is achieved by controlling the refractive indices of the waveguide elements. The physical mechanism used to control the refractive indices of these waveguides depend on the waveguide material. Silica planar waveguide type switches typically employ an electrode that changes the temperature of a waveguide by a thermo-optic effect. Thermo-optic devices are described in U.S. Pat. No. 6,084,050, the entire contents of which are incorporated by reference. Other waveguide switches include semiconductor waveguide switches controlled by current injection, and ferroelectric crystal ($LiNbO_3$)-based switches, controlled by an applied electric field. Although semiconductor-based switches and $LiNbO_3$-based switches can achieve high switching speeds (switching time $\sim 10^{-9}$ sec), it is difficult to realize polarization independent switches with these technologies.

Silica planar waveguide switches employ a Mach-Zender type interferometer as basic switching elements. For example, a thermo-optic phase-shifter in an interferometer changes the propagation delay in the interferometer. Although the response time of conventional thermo-optic switches is of the order of a ms, thermo-optic switches offer many advantages such as polarization independence and stability against environmental changes. By combining thermo-optic switches into a 2×2 array, a large scale matrix optical switch can be realized, as long as the switch elements are loss-free and 100% of the input power is transferred to desired output ports. However, in real switching elements, several problems arise including loss imbalance among the output ports and cross-talk. Typically, dummy switches are employed for overcoming such effects.

According to the present invention, Mach-Zender interferometer switches can utilize the fast response time/small area thin-film thermoelectric devices of the present invention to change propagation delays. Thermoelectrically heated/cooled thin-film thermoelements are attached, according to the present invention, to silica waveguides to obtain the necessary switching function. The waveguide switches can be cross-connected waveguides. Each section of the waveguide can be heated or cooled so as to change the refractive index, affecting the optical pathlength, and thus determining whether constructive or destructive interference occurs. The thin-film thermoelectric elements of the present invention can switch in tens of μs (see FIG. 5) or even smaller. Two to three orders of improvement in speed with electro-thermal Mach-Zender optical switches coupled to the thermoelectric coolers of the present invention are expected as compared to conventional thermo-optical switches. For example, the reversibility of temperature (with reversal of current) with thin-film thermoelectric devices of the present invention can be used advantageously in a "quenching" mode to further increase the speed of a waveguide switching element of the present invention.

Furthermore, simultaneous heating (in one interferometer leg) and cooling (in the other interferometer leg) will, according to the present invention, enhance the differential gain in the switching efficiency. These dual-temperature electro-thermal Mach-Zender optical switches will considerably reduce the number of dummy switches typically employed. This reduction leads to reduced losses and therefore a reduced need for periodic fiber amplification.

The thin-film fast response time/small area thermoelectric cooling/heating devices of the present invention can be combined with polymeric optical waveguide switches as well. Fluorinated polymers have large thermo-optic coefficients. The combination of such large coefficients with the ability to obtain both heating and cooling with thin-film thermoelectric devices can, according to the present invention, produce low-loss, large, planar switching networks. Thin-film thermoelectrically controlled thermo-optical switches can be operated as electro-thermal optical switching networks, offering advantages such as low insertion loss, polarization insensitive operation, long-term solid-state reliability, and suitability for large-scale integration.

Large scale switches require large refractive index changes at the switching element. This requirement means that temperature excursions beyond the average room temperature excursions must be realized before a switching phenomena can be distinguished from noise due to room temperature variations. Heating, as in conventional thermo-optic switches, is not an attractive way to implement such large temperature excursions since large heating temperatures are not desirable for other components in the integrated optical system. However, a combination of cooling and heating, simultaneously, can achieve larger temperature differentials. For example, with a thermo-optic coefficient of $dn/dT \sim 1e-4$ $K^{-1}$, as in the polymeric waveguides, approximately 75° C. of heating (implying ~100° C. hot point if room temperature is 25° C.) is necessary to obtain 0.75% refractive index difference waveguides (i.e. 0.75%-D waveguide). This 0.75%-D waveguides can be used for a 8×8 switching matrix. For about the same reliability and performance-loss, a 16×16 matrix with a 1.5%-D waveguides is necessary. This would imply, for a dn/dT $1e-4$ $K^{-1}$, a hot point of 175° C. with a reference point of 25° C. However, if simultaneous heating and cooling were used to create a large temperature differentials, a lower "hot" points would be realized. For example, for a 0.75%-D waveguide with a 50° C. hot point and −25 °C. cold point could be employed using the anywhere anytime thermoelectric cooling/heating devices of the present invention. Similarly, for a 1.5%-D waveguide, a 100° C. hot point and −50° C. cold point could be employed using the anywhere anytime thermoelectric cooling/heating devices of the present invention. A greater than 1.5%-D waveguides can be realize utilizing a combination cooling/heating thermoelectric device to create at least a 16×16 switching matrix. The use of "lower" absolute hot temperatures, for the same induced refractive index change, avoids high-temperature deterioration of polymeric materials, thus opening up the range of electro-optic materials which can be used in this application.

In another embodiment the fast response time/small area thermoelectric cooling/heating thin-film technology of the present invention is applied to optoelectronic circuitry. One technology enabler for all-optical networking is a component known as a multi-wavelength substrate. Otherwise, extensive wavelength-selective routing and add/drop capabilities are needed to provide rigid capabilities and thus costly implementations.

The ability to design and deploy an optical network layer hierarchy has been limited by the conventional process in which all lasers on a wafer have the same emission wavelength and lasing characteristics. One approach is to manufacture on a single wafer diode lasers (e.g. distributed feedback DFB lasers) with different emission wavelengths within a gain bandwidth of 1530 nm to 1560 nm of the erbium doped fiber amplifier, and to control the grating pitch to increments of less than 0.01 nm. The control of the grating pitch can be enormously relaxed, leading to greater device yields, if temperature variations (using electro-thermal spot cooling/heating control) is combined with grating control. Temperature variations change the bandgap of the lasing semiconductor material in the active region of the laser, which in turn controls the lasing wavelength. For example, 30K heating or cooling from ambient can change the wavelength by about 15 nm. Thus, a change from 30K cooling to 30K heating, will produce a 30 nm wavelength shift. Thus, a multi-wavelength hybrid electro-thermal-spot-temperature-controlled DFB lasers for multi-wavelengths laser applications is realized by the present invention and permits active wavelength shifting.

Vertical-cavity surface-emitting lasers (VCSELs) are well suited for optoelectronic applications due to the fact that the well-confined circular surface emission is compatible with easy/efficient coupling to optical fibers as well as that the devices can be pre-tested at the wafer level before packaging. VCSEL and VCSEL-based devices are described in U.S. Pat. No. 6,154,479, the entire contents of which are incorporated herein by reference. VCSELs are compatible with wafer-scale manufacturing. Here again, electro-thermal spot cooling/heating control can be employed to thereby control the bandgap of the active lasing material, to produce multiple wavelengths. Thus, multiple wavelength electrothermal spot-temperature-controlled lasers are realized by the multi-wavelength electro-thermal-spot-temperature-controlled VCSELs of the present invention. Large-area VECSEL devices are about 0.01 to 0.02 cm². Spot cooling of such devices can be accommodated by the thermoelectric devices of the present invention.

Another technology enabler for all-optical networking is the ability to wavelength translate for payload transparency demanded by carriers on optical networks. The multi-wavelength hybrid electro-thermal-spot-temperature-controlled DFB lasers and the multi-wavelength electro-thermal-spot-temperature-controlled VCSELs of the present invention will, along with the electro-thermal spot heating/cooling of Mach-Zender optical switches, attenuators, and filters enable flexibility in wavelength operation and wavelength shifting operations. The integration of optical components including DFB lasers into optical switching networks have been described in U.S. Pat. No. 6,072,925, the entire contents of which are incorporated herein by reference.

In another embodiment of the present invention, the thermoelectric devices of the present invention are thermally in contact with thermocapillary optical switches enabling operation of high-speed thermocapillary switches. Thermocapillary switches seal fluid with a bubble in a slit. Thermocapillary and bubble switches have been described in U.S. Pat. No. 6,062,681, the entire contents of which are incorporated herein by reference. Typically heaters at either end of the slit shift the bubble in the fluid from side to side away from the heat source to manipulate the optical path, thus achieving an optical gate. By replacing the passive micro-heaters with the active thermoelectric devices of the present invention (which can be reversibly cooled by switching the current direction), the switching speed is enhanced. The augmentation of such a slit with spot cooling and the fast response thermoelectric devices of the present invention enhances the switching efficiency, leading to lower optical loss. Thus, high speed thermocapillary switches can utilize a higher number of ports than what is available today with the same optical loss. With reduced optical loss, the high-speed thermocapillary switches of the present invention are applicable to be used other than just as protection switches which route traffic around network disruptions.

In another embodiment of the present invention, the thermoelectric devices of the present invention are thermally in contact with bubblejet optical switches, thus enabling operation of high-speed bubblejet switches. Bubblejet switches involve a small hole at each intersection of a waveguide, filled with a fluid that has an index of refraction identical to that of the waveguide. Consequently, light traverses each intersection as though no trench was there. However, by micro-heating the fluid, a small bubble forms in the intersection and diverts optical signals down another path. By replacing the passive micro-heaters with the active thermoelectric devices of the present invention (which can be reversibly cooled by switching the current direction), the switching speed is enhanced. The augmentation of such a waveguide suitably with spot cooling and heating can enhance the switching efficiency, leading to less optical loss.

In a further embodiment, a 3-substrate sandwich which monolithically integrates a "middle-wafer" VCSEL chip with electro-thermal spot cooling/heating thin-film thermoelectric chip on one side for wavelength selection/control and another electro-thermal spot cooling/heating thin-film thermoelectric chip on the other side for directional coupling/switching/attenuation functions can be realized by the present invention.

In still another embodiment, the electro-thermal spot cooling/heating thermoelectric technology of the present invention can, according to the present invention be integrated with optoelectronic modules. For example, a typical VCSEL-based transceiver module has a bias circuit, laser driver, monitor diodes, VCSEL arrays, out-going optical connectors, in-coming optical connectors, photodetectors, pre-amplification circuits, and post-amplification circuits. Using electro-thermal spot cooling/heating chip of the present invention, it is possible to individually optimize the performance of many of these components on a chip. In another embodiment of the present invention, high-speed spot temperature control of the thermoelectric devices of the present invention is thermally coupled to an electroholographic optical switch. The electroholographic optical switch, according to the present invention, can include Potassium Lithium Tantalate Niobate (KLTN) crystals in packet-switching optical networks. Typically, KLTN crystals have dimensions of about 2 mm×2 mm×1.5 mm. Conventional bulk thermoelectric technology is not well suited to achieve cooling in such small crystals. R. Hofmeister et. al., Physical Review Letters, vol. 69, pp. 1459–1462, (1992), the entire contents of which are herein incorporated by reference, have shown that KLTN crystals can be cooled to temperatures around −23° C. to enhance the quadratic electro-optic effect, the basis for electroholographic optical switching. The quadratic electro-optic effect dramatically increases as a ferroelectric-paraelectric transition temperature of −23° C. is approached. Cooling of KLTN crystals to achieve higher diffraction efficiency or electro-optic efficiency in electroholographic optical switches can reduce the need for large voltages in switching networks. For example, in KLTN crystals, for the same quadratic electro-optic effect leading to a diffraction efficiency of 5%, an electric field of nearly 1500 V/cm is required at 21° C. whereas an electric field of only 250 V/cm at −15° C. Thus, for a given crystal of thickness 1.5 mm, the DC voltage needed to provide the electric field would drop from around 225 V to approximately 38 V. According to the present invention, spot-cooling KLTN crystals, with areas such as for example of a 0.1 mm×0.1 mm size, allows smaller voltages to be used for producing the requisite electric field. Smaller voltages are attractive from a system implementation point-of-view.

Figure 15:
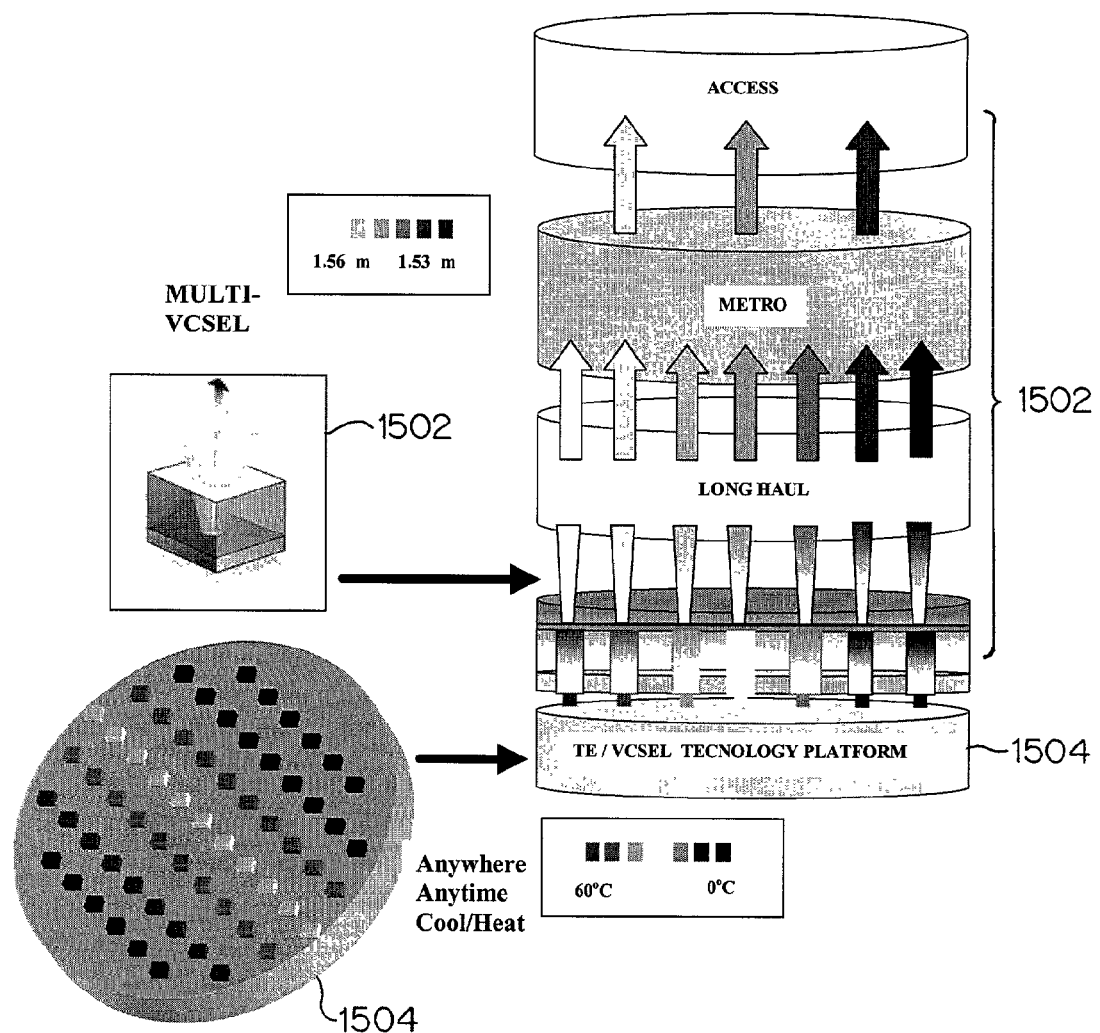
FIG. 15 is a schematic depiction of a multiple wavelength VCSEL array located on the thermoelectric device of the present invention.
Figure 16:
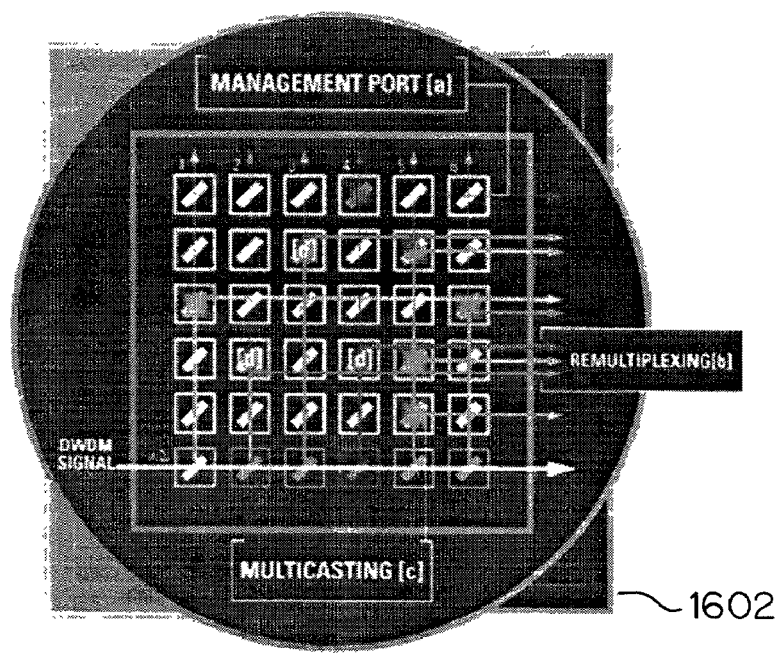
FIG. 16 is a schematic depiction of an elecrto-holographic router switching matrix located on the thermoelectric device of the present invention.
Figure 16:
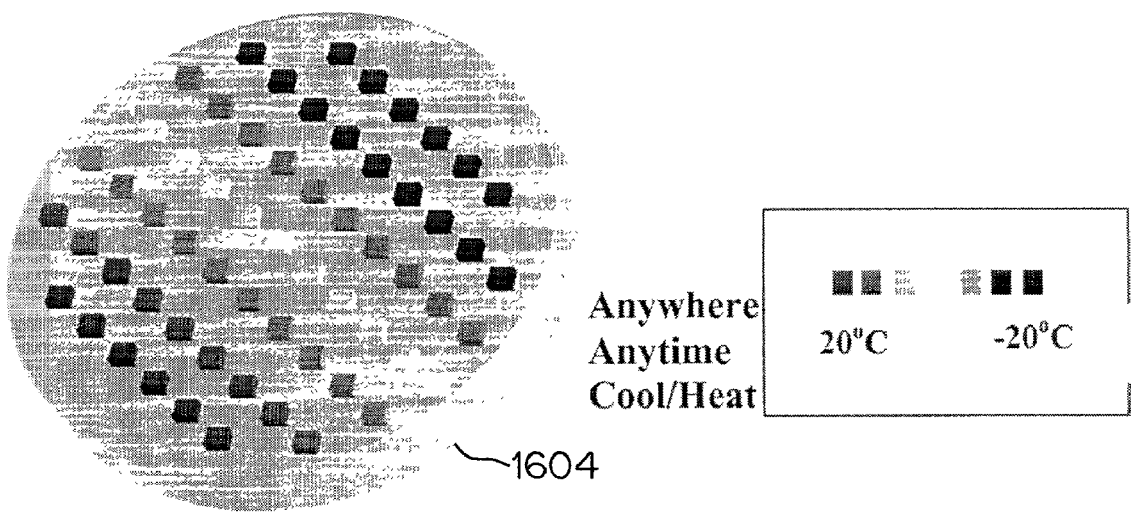

Furthermore, thermal expansion effects complicate the storage of volume holograms, stored as spatial distributions of space charge. Temperature stabilization of KLTN crystals in electroholographic optical switches the thermoelectric cooling technology of the present invention enables high-resolution (i.e., the smallest) spacing of the various wavelengths that are switched by the KLTN crystals. The higher the resolution of this spacing, the larger the number of wavelengths that can be precisely switched in dense wavelength division multiplexing (DWDM) networks. Similarly, according to the present invention, temperature control is utilized to vary a spatial distribution of space charge, thereby tuning the holographic grating to a particular wavelength. Thus, the same physical grating, with variable temperature control offered by the thermoelectric cooling technology of the present invention, allows wavelength translation needed for payload transparency in DWDM optical networks. FIG. 15 is a schematic depiction of a multiple wavelength VCSEL array 1502 located on a thermoelectric device 1504 of the present invention. FIG. 16 is a schematic depiction of an elecrto-holographic router switching matrix 1602 located on the thermoelectric device 1604 of the present invention.

In yet a further embodiment of the present invention, the small area/fast response time of the thermoelectric devices of the present invention are utilized to control other electro-optic crystals operating in the paraelectric regime.

In another embodiment of the present invention, the small area/fast response time of the thermoelectric devices of the present invention are utilized in an electronics module to selectively cool or control the temperature of discrete module components, such as for example diodes, capacitors, inductors, filter networks, memory chips, or CPU chips on the electronic module.

In still a further embodiment, the fast response time/small area thin-film thermoelectric cooling devices of the present invention can be used as identification tags for military personnel, military systems, and even commercial systems that are scanned by IR-imaging devices. The fast response time/small area cooling devices can be arranged in a particular order (as shown in FIG. 2) to produce fast response time IR-tags. These IR-tags can be made to be powered only when a signal is received. These tags, which are based on localized hot or cold spots (as shown in FIG. 2) are, according to the present invention, amenable for digitizing, encryption, and safe electronic transmission.

In another embodiment of the present invention, the fast-response thermoelectric devices of the present invention are utilized in applications for cell and molecular engineering. As such, the thermoelectric devices of the present invention provide precise temperature control in probes and prosthetics used for microsurgery and bio-tissues probes. Specific designs to implement spot cooling or heating towards cell and molecular levels, with respect to their dimensions and control, are shown for exemplary purposes below. In addition, specific application examples of the present invention are illustrated.

Figure 11:
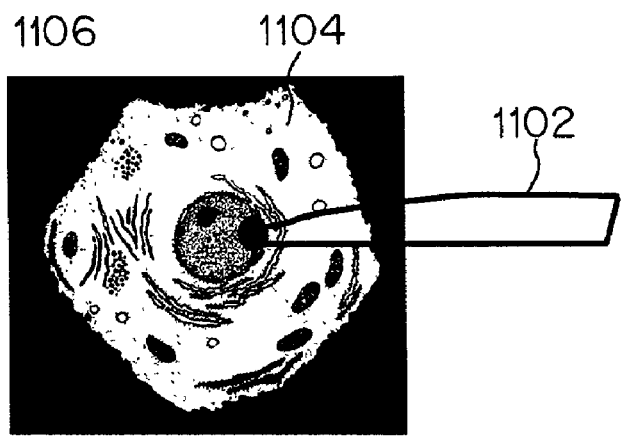
FIG. 11 is a schematic depiction of a thermoelectric probe of the present invention locally contacting a single cell of a specimen.

FIG. 11 is a schematic depiction of a thermoelectric probe 1102 of the present invention locally contacting a single cell 1104 of a specimen 1106. Shown in FIG. 11 is an example of a cell about 50 μm in size. The ability to obtain spot cooling or heating, at flux levels in a preferred range of 0.1 to 2000 W/cm$^2$ enabled by the present invention, can be used to keep certain regions such for example the nucleus of the cell "cool" or "hot", while engineering of other cell areas. Similarly, the other parts of the cell can be kept cool or hot when the chemistry of the nucleus is manipulated with a hypodermic needle.

Figure 12:
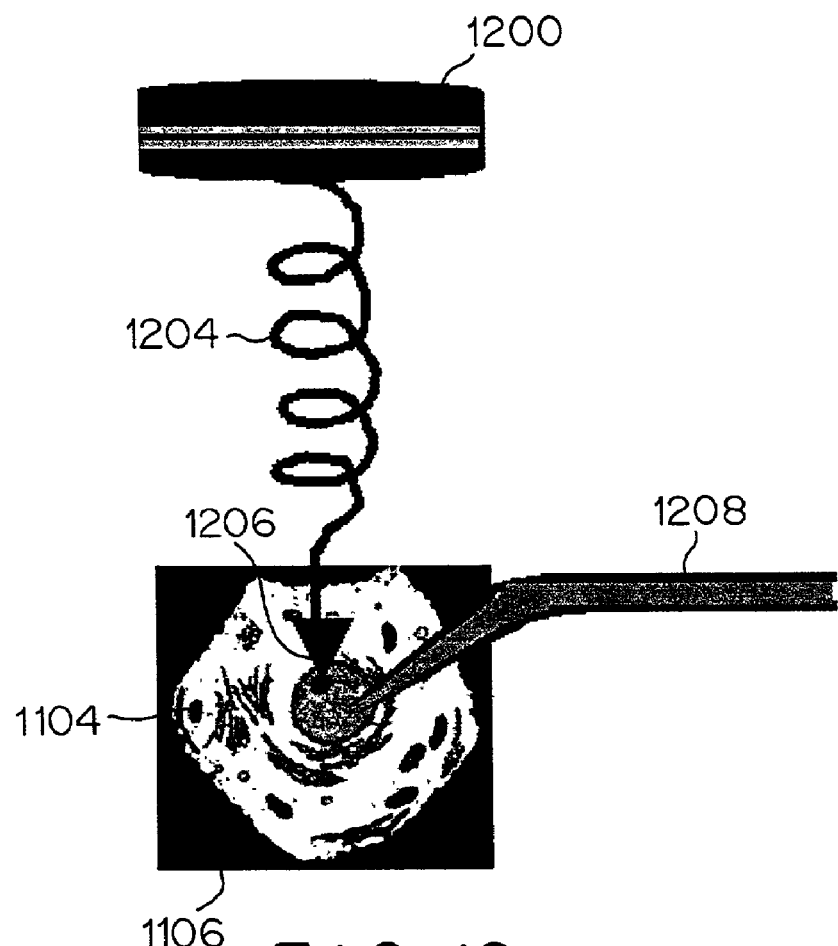
FIG. 12 is a schematic of a nano-scale thermal transducer of the present invention employing a cantilever arrangement contacting a single cell.

A thermoelectric module 1200 of the present invention thermally contacts specific spots of the cell nucleus using for example a spring coil as a cantilever, and the cooling/heating module cools or heats those specific spots of the cell. FIG. 12 is a schematic of a nano-scale thermal transducer 1202 of the present invention employing a cantilever 1204 contacting a single cell 1104. With the cantilever set up, a tip 1206 approaching very small dimensions in the range of nanometers is a highly flexible stylus exerting a lower downward force on delicate cell parts, resulting in less distortion and cell damage. A tube 1208 can provide constituents to the cell 1106 to induce chemical or biological reactions with the specimen 1106.

The cantilever of the present invention is similar to arrangements known in the art for atomic force microscopy (AFM). The cantilevers of the present invention have spring constants of about 0.1 N/m, lower than a spring constant of 1 N/m. The integration of a thermoelectric cooling/heating device or module with a cantilever, especially the cantilevers similar to those used in AFM, provides according to the present invention for "nanometer-size temperature control" of bio-tissues, cells, and perhaps other atomic-scale structures in nano technology such as for example nano-self-assembly.

The resonant frequency of a spring is given by:

$$\text{Frequency} = \frac{1}{2\pi}\sqrt{\frac{K}{M}},$$

where K is the spring constant and M is the mass of the spring.

Thus in contrast to AFM images, where low mass is also required (in addition to low spring constant) to keep the resonant frequency high for high speed imaging, in nano-thermal transducers (or probes) of the present invention, a higher mass spring may be tolerable, if not used in a scanning mode.

In addition to spot cooling or heating of certain intra-cell features, the nano-thermal transducers of the present invention can be utilized for manipulation of individual DNA strains and other molecules, such as large molecular strands of sugar, proteins, etc. These nano-thermal transducers can control reaction chemistries and hence biological processes of both large scale and small scale molecular structures such as for example controlling the reactions of sugar and proteins by controlling the reaction chemistry of reaction mediators (such as for example ribo-nucleic acid RNA), thereby leading to alternate approaches to genetic engineering.

The present invention also permits the study of molecular level calorimetry. In this embodiment of the present invention, the heat of the reaction is transmitted through a nano-thermal transducer, in an adiabatic system, and applied as a thermal load onto a thermoelectric (TE) device. For a fixed current through the TE device, the extra thermal load reduces the differential temperature ($\Delta T$) that exists across the TE device by a certain quantity. A reduction in the differential temperature ($\Delta T$) translates into a reduction in the Peltier component voltage across the device.

The molecular reaction proceeds over a certain time period. The faster the voltage of the TE device can be measured, the more sensitive the TE device will be. This requires smaller thermoelectric element areas because, for a fixed heat flux from the reaction, more $\Delta T$ will be generated with a smaller-size thermoelement, allowing as shown below for sensitivities approaching the heat liberated by a single molecular reaction.

Figure 13:
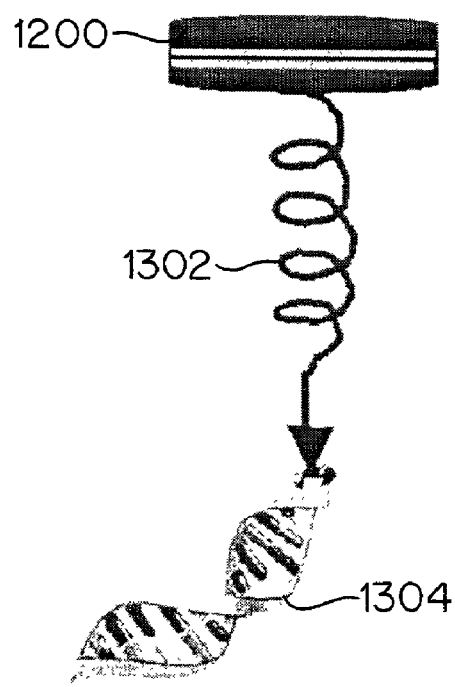
FIG. 13 is a schematic diagram depicting a nano scale thermal transducer of the present invention employing a cantilever arrangement contacting specific spots of large molecular structures such as a hybridized DNA pair.

FIG. 13 is a schematic diagram depicting a nano scale thermal transducer of the present invention employing a nano-scale cantilever 1302 contacting specific spots of large molecular structures such as a hybridized DNA pair 1304. Materials needed for the nano-thermal transducer (i.e. the cantilever) include materials with high thermal conductivity and a low thermal emissivity; perhaps diamond-like materials can be considered as well. For example, thermal conductivities in the range of 0.75 to 20 W/cm-K, and emissivities <0.3 are preferred in the nano scale thermal transducers.

The spring constant is a function of frequency response required. For example, for molecular calorimetry with high spatial resolution as well a scanning mode calorimeter, low spring constant materials in addition to low density materials are utilized. For example, low density materials (i.e. less than 3.0 gm/cm$^3$) like diamond (e.g., 2.25 g/cm$^3$) or aluminum (e.g., 2.7 g/cm$^3$) are preferred for the present invention.

Figure 14:
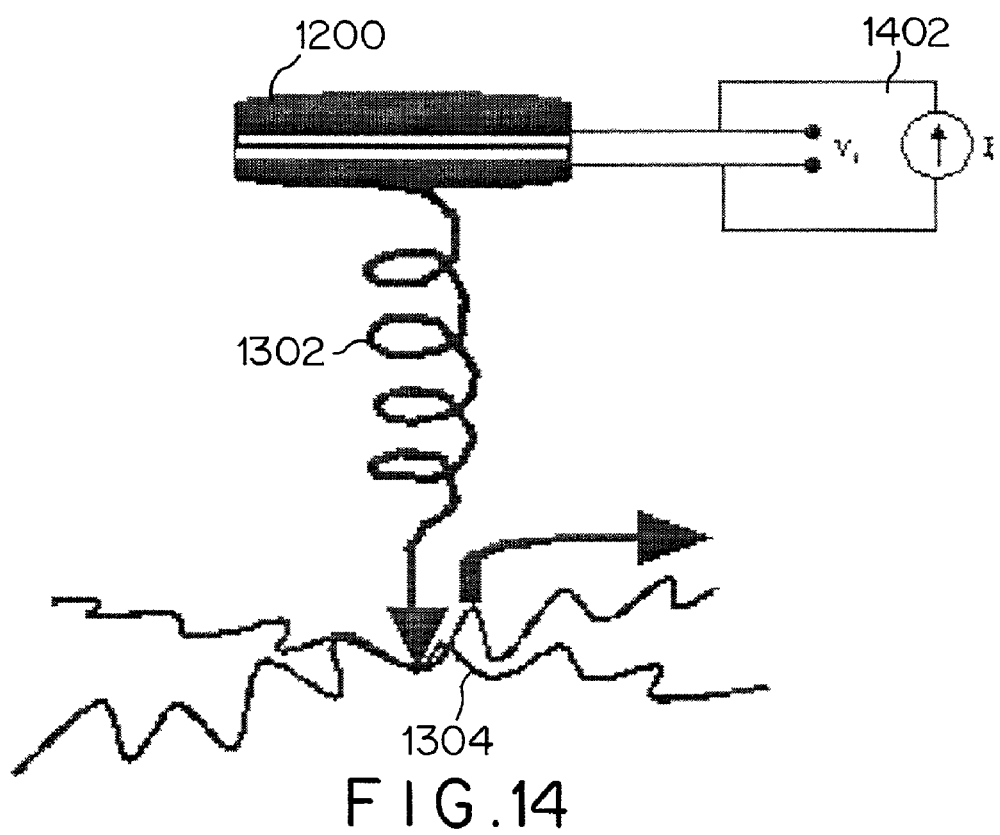
FIG. 14 is a schematic depicting an apparatus of the present invention for detecting the heat released from a small-scale region.

An example of nano-scale thermal control, in the attachment of a molecular fragment, at the tip of the hybridized DNA pair is shown schematically in FIG. 14 below. FIG. 14 is a schematic depicting an apparatus of the present invention for detecting the heat released from a small-scale region. The apparatus is similar to the apparatus in FIG. 13, but includes a constant current power supply configured to deliver a constant current to the thermoelectric module 1200. The sample or specimen depicted in FIG. 14 is an organic, biological sample. However, the present invention is applicable to calorimetric determination of heat released from inorganic samples as well as other devices that locally generate or dissipate heat.

The ability to control temperature at a nanoscale or molecular level using a combination of high-power density (or high power flux) thin-film thermoelectric devices (as a heat pump) and AFM tip-like nanothermal transducers enables, according to the present invention, the measurement of heat of reactions at the nanoscale or molecular level or small geometries (volume).

A total voltage $V_T$ across the thermoelectric device of FIG. 14 is given by:

$$V_T \approx V_R + V_O,$$

where $V_T$ is the total voltage measured, $V_R$ is the ohmic component and $V_O$ is the Peltier component.

Also, $V_T \approx IR + \alpha_{eff}\Delta T,$ where R is the "Ohmic" resistance of the thermoelectric module, I is a constant current supplied through the thermoelectric device, $\alpha_{eff}$ is the effective Seebeck coefficient of the thermoelectric module. For example, a module including m 'p' elements and including m 'n' elements, each with an $\alpha_p$ and an $\alpha_n$ respectively, will have:

$$\alpha_{eff} \approx m(\alpha_p + \alpha_n).$$

Combining these equations, $(V_T - IR) = \alpha_{eff}\Delta T = V_O$

Thus, from the above equation, by measuring $V_T$, knowing I, knowing R, and knowing $\alpha_{eff}$, $\Delta T$ is derived. R and $\alpha_{eff}$ of the thermoelectric module can be measured independently by standard techniques to compensate for temperature variations in the known values.

$$\text{Thus, } \Delta T = (V_T - IR)/\alpha_{eff} \quad (5)$$

From energy balance considerations, the heat flow Q is given by:

$$Q = \pi I - \tfrac{1}{2}I^2 R - K\Delta T, \quad (6)$$

where $\pi$ is the Peltier coefficient of the module and K is the thermal conductance of the module, given by k $(a/l)_{eff}$ with k being the thermal conductivity and $(a/l)_{eff}$ being the effective aspect ratio of the width a to the length l of the thermoelectric device. From equations (5) and (6), knowing k and by measuring $\Delta T$ (and hence $V_T$), Q can also be derived.

Thus, Q can be the heat released per unit time from the reaction zone as shown in FIG. 14. Note that there are always heat losses. Furthermore, according to the present invention, differential calorimetry can be used to derive Q.

Assume a first steady state condition, with a detectable heat load on the cantilever probe from a background $Q_1$ heat flux:

$$\Delta T_1 = (V_{T1} - IR)/\alpha_{eff}$$

$$Q_1 = \pi I - \tfrac{1}{2}I^2 R - K\Delta T_1$$

Assume a steady state heat load plus heat of reaction per unit time:

$$\Delta T_2 = (V_{T2} - IR)/\alpha_{eff}.$$

$$Q_2 = \pi I - \tfrac{1}{2}I^2 R - K\Delta T_2$$

By measuring $V_{T1}$ and $V_{T2}$, for a specific current I and assuming $\pi$, k, $\alpha_{eff}$, R do not change significantly with small temperature changes, the heat of reaction is derived as follows:

Assuming the reaction is exothermic, and adiabatic condition, all the heat will be released at the nano-thermal transducer. Thus, for a constant current I through the thermoelectric module, ΔT across the module should decrease with an external heat load. Thus, $$\Delta T_1 - \Delta T_2 \cong \{(V_{T1}-IR)/\Delta_{eff}\} - \{(V_{T2}-IR)/\alpha_{eff}\} = (V_{T1}-V_{T2})/\Delta_{eff}$$

$Q_2$–$Q$, defined as the heat of reaction '$Q_0$' is:

$$\cong K\Delta T_2 + K\Delta T_1$$

$$\cong K(\Delta T_1 - K\Delta T_2)$$

$$\cong K(V_{T1}-V_{T2})/\alpha_{eff}$$

Therefore, $Q_0$, the heat of an exothermic reactor produced at A, measured by a differential voltage at the thermoelectric module measured in Watts or Joule/sec is $K(V_{T1}-V_{T2})/\alpha_{eff}$.

A smaller K, a larger $\alpha_{eff}$, and a smaller $V_{T1}-V_{T2}$ allows the measured $Q_0$ to be smaller; i.e., the smaller K, the larger the $\alpha_{eff}$, and the smaller the $[V_{T1}-V_{T2}]$ the more precisely $Q_0$ can be measured.

For example, to measure the standard "heat of reaction" in Joules or calories, one must integrate as a function of time.

$$Jo = \text{Energy released in the reaction} = \int_{t=o}^{t=\infty} Qo \cdot dt$$

Typically, a reaction persisting over three to five times constants ($t_R$) can produce a change of $V_T$ during that period.

$$\text{Thus, } J_O \cong \int_{t=o}^{t=5\,tr} Qo \cdot dt$$

The fast time response of the thin-film thermoelectric device of the present invention allows an accurate determination of Jo, the total heat of reaction. Also a fast time response of the thin-film module allows the thermoelectric device of the present invention to study a time dependent response of reactions.

If k is the thermal conductivity, and is, for example, 10 mW/cm-K:

$$\frac{a}{l} = 2 \times 10^{-3},$$

assuming 5 μm thick film and area of device as 10 μm×10 μm $\alpha_{eff}$=500 μV/K for 1 p and 1 n element, assuming an accuracy of $\Delta V_T$=1 μV; the accuracy of $Q_O$ is $4\times10^{-8}$ W. For $3t_R \cong 50$ μsec, then an estimate of $J_o$ is $100\times10^{-14}$ Joules or ~1 pJ. Note that more p and n elements can increase the $\alpha_{eff}$ and therefore increase the sensitivity of the measured $Q_O$.

For a 1 μm×1 μm thermoelectric element, an accuracy of $\Delta V_T$ of 1 nV, and advanced noise-reduction techniques, and digital-signal processing, according to the present invention, an estimate a lower limit of a measurable Jo is $1\times10^{-17}$ Joules or 1/100$^{th}$ of a femtojoule.

In comparison to the heat released by each molecule during a reaction: Assume a heat of reaction=150 Kcal/mole.

$$= 150 \times 1000 \times 4.18 \frac{\text{Joules}}{\text{mole}}$$

$$J_{molecule} \cong 1 \times 10^{-18} \text{ Joules/molecule}$$

Thus, one anticipates a lower limit of the measured heat of reaction constitutes a reaction of only about 10 molecules from the fact that Jo is $1\times10^{-17}$ Joules.

Further, a 0.5 μm×0.5 μm thermoelement able to measure 0.1 nV can reduce $3t_R$ to ~30 μsec. Consequently, $$Jo_{measurable} \cong 1 \times 10^{-17} \times \left(\frac{1\ \mu m \times 1\ \mu m}{0.5\ \mu m \times 0.5\ \mu m}\right)^{-1} \times \left(\frac{0.1 nV}{1 nV}\right) \times \left(\frac{30\ \mu sec}{50\ \mu sec}\right)$$

$$\cong 1.5 \times 10^{-19} \text{ Joules}$$

Thus, with such a small scale thermoelement, the sensitivity would easily allow for the measuring the heat flux generated by the reaction of approximately 1 molecule, assuming a 150 kcal/mole reaction or perhaps as low as 22.5 Kcal/mole. Even lower heat of reactions of each molecule are perhaps measurable with larger $\alpha_{eff}$ and/or larger number of thermoelectric elements and/or better sensitive set-up.

Numerous modifications and variations of the present invention are possible in light of the above teachings. It is therefore to be understood that within the scope of the appended claims, the invention may be practiced otherwise than as specifically described herein.

The invention claimed is:

1. A thermoelectric cooling and heating device comprising:
   a substrate;
   a plurality of thermoelectric elements arranged on one side of the substrate and configured to perform at least one of selective heating and cooling, each thermoelectric element including, a thermoelectric material, a Peltier contact contacting the thermoelectric material and configured to form under electrical current flow at least one of a heated junction and a cooled junction, and electrodes configured to provide current through the thermoelectric material and the Peltier contact; and
   a controller configured to separately control at least a first electrode of a first thermoelectric element and a second electrode of a second thermoelectric element, the controller being further configured to bias the first and second electrodes to provide simultaneous heating of a first portion of the substrate adjacent the first thermoelectric element and cooling of a second portion of the substrate adjacent the second thermoelectric element.

2. The device of claim 1, wherein the thermoelectric material comprises:
   an n-type thermoelectric material; and
   a p-type thermoelectric material with the Peltier contact abridging the n-type and p-type thermoelectric materials such that the electrodes contact a side of the n-type thermoelectric material opposite the Peltier contact and a side of the p-type thermoelectric material opposite the Peltier contact.

3. The device of claim 2 wherein the controller is configured to selectively bias the electrodes of each of the thermoelectric elements.

4. The device of claim 3, further comprising:
a surface header contacting said plurality of thermoelectric elements and having a transverse thermal conductivity across a thickness of said surface header which is higher than a lateral thermal conductivity along a plane of the surface header.

5. The device of claim 4, wherein the surface header comprises a high thermal conductivity material in a low thermal conductivity matrix and is patterned on an array grid such that the high thermal conductivity material of the surface header aligns with the thermoelectric elements.

6. The device of claim 2, wherein both the n-type thermoelectric material and the p-type thermoelectric material comprise thin-film thermoelectric layers less than 10 μm (micrometer) thick.

7. The device of claim 2, wherein both the n-type thermoelectric material and the p-type thermoelectric material comprise high ZT thermoelectric materials.

8. The device of claim 7, wherein the ZT thermoelectric materials comprise superlattice structured thin-film materials.

9. The device of claim 8, wherein the superlattice structured thin-film materials comprise high-ZT materials including at least one of $Bi_2Te_3$-based superlattice materials, Si/Ge superlattice materials, and PbTe-based superlattice materials.

10. The device of claim 1, wherein the thermoelectric elements comprise microelectronically patterned thin-film thermoelectric elements.

11. The device of claim 1, further comprising:
a receptacle thermally contacting the thermoelectric elements and including an array of patches configured to receive a biological material.

12. The device of claim 11, wherein the patches of the receptacle are aligned with the thermoelectric elements.

13. The device of claim 12, wherein the patches are patterned lithographically to have dimensions ranging from 1 to 500 m.

14. The device of claim 11, wherein the biological material includes DNA material for genomics analysis.

15. The device of claim 11, wherein the biological material includes proteins for proteomics analysis.

16. The device of claim 11, wherein the thermoelectric elements are configured to at least one of heat and cool the biological material.

17. The device of claim 16, wherein the patches are configured to receive as the biological material single stranded DNA and the thermoelements are configured to control the temperature of the single stranded DNA for polymorphism conformation.

18. The device of claim 16, wherein the thermoelectric elements are configured to at least one of heat and cool DNA double-helix material to form single-stranded DNA material.

19. The device of claim 16, wherein the thermoelectric elements are configured to provide localized thermo-genetic switches to switch at least one of DNA chemistry, DNA-RNA chemistry, protein synthesis, cross conversion dominant genes to recessive genes, and production of antibodies.

20. The device of claim 16, wherein the patches are configured to receive as the DNA material single stranded DNA and the thermoelements are configured to control the temperature of the single stranded DNA for polymorphism conformation.

21. The device of claim 16, wherein the thermoelectric elements are configured to have a thermal response time less than 1.0 ms.

22. The device of claim 21, wherein the thermoelectric elements are configured to heat shock biological material including at least one of DNA material, proteins, and protein-related DNA.

23. The device of claim 11, wherein the controller is configured to provide an offset voltage to selected thermoelectric elements in order to spot-charge the selected thermoelectric elements.

24. The device of claim 23, wherein the thermoelectric elements are configured to at least one of heat and cool the biological material.

25. The device of claim 24, wherein the thermoelectric elements are configured to have a thermal response time less than 1.0 ms.

26. The device of claim 25, wherein the thermoelectric elements are configured to heat shock biological material including at least one of DNA material, proteins, and protein-related DNA.

27. The device of claim 24, wherein the thermoelectric elements are configured to provide localized thermo-genetic switches to switch at least one of DNA chemistry, DNA-RNA chemistry, protein synthesis, cross conversion dominant genes to recessive genes, and production of antibodies.

28. The device of claim 24, wherein the patches are configured to receive as the DNA material single stranded DNA and the thermoelements are configured to control the temperature of the single stranded DNA for polymorphism conformation.

29. The device of claim 1, further comprising:
a microsurgical tool thermally contacting the thermoelectric elements and configured to control the temperature of bio-tissues in contact with the microsurgical tool.

30. The device of claim 1, further comprising:
a thermo-optic phase shifter in thermal contact with the plurality of thermoelectric elements and configured to vary an index of refraction of an optical medium via temperature variations.

31. The device of claim 30, wherein the thermoelectric elements are configured to heat the thermo-optic phase shifter.

32. The device of claim 30, wherein the thermoelectric elements are configured to cool the thermo-optic phase shifter.

33. The device of claim 30, wherein the thermoelectric elements are configured to cycle a temperature of the thermo-optic phase shifter.

34. The device of claim 33, wherein the thermoelectric elements are configured to have a thermal response time less than 1.0 ms.

35. The device of claim 30, wherein the thermo-optic phase shifter includes fluorinated polymers with larger thermo-optic coefficients than silica glasses.

36. The device of claim 1, further comprising:
at least one laser thermally coupled to the plurality of thermoelectric elements and having a semiconductor material defining a band gap varied by temperature variations of the thermoelectric elements so as to control a lasing frequency of the at least one laser.

37. The device of claim 36, wherein the thermoelectric elements are configured to heat the at least one laser.

38. The device of claim 36, wherein the thermoelectric elements are configured to cool the at least one laser.

39. The device of claim 36, wherein the thermoelectric elements are configured to cycle a temperature of the at least one laser.

40. The device of claim 39, wherein the thermoelectric elements are configured to have a thermal response time less than 1.0 ms.

41. The device of claim 36, wherein the laser is a vertical cavity surface-emitting laser.

42. The device of claim 36, wherein the laser is a distributed feedback laser.

43. The device of claim 1, further comprising:
an integrated module including at least one electronic component in thermal contact with the plurality of thermoelectric elements and configured to control a temperature of the at least one electronic component of the integrated module.

44. The device of claim 43, wherein the thermoelectric elements are configured to selectively heat the at least one electronic component.

45. The device of claim 43, wherein the thermoelectric elements are configured to selectively cool the at least one electronic component.

46. The device of claim 43, wherein the thermoelectric elements are configured to selectively maintain a temperature of the at least one electronic component.

47. The device of claim 43, wherein the integrated module comprises an electronics module.

48. The device of claim 47, wherein the at least one electronic component includes at least one of a diode, a capacitor, a inductor, a filter network, a memory chip, and a CPU chip.

49. The device of claim 43, wherein the integrated module comprises an optoelectronics module.

50. The device of claim 49, wherein the optoelectronics module includes at least one of a bias circuit, a laser driver, a monitor diode, a VCSEL array, an out-going optical connector, an in-coming optical connector, a photodetector, a pre-amplification circuit, and a post-amplification circuit.

51. The device of claim 43, wherein the integrated module comprises an infrared imaging array.

52. The device of claim 1, further comprising:
a switching optical network including optical switches in thermal contact with the plurality of thermoelectric elements and configured to control a temperature of the optical switches in the switching optical network.

53. The device of claim 52, wherein the optical switches comprise electroholographic optical switches.

54. The device of claim 52, wherein the electroholographic optical switches comprise potassium lithium tantalate niobate crystals.

55. The device of claim 52, wherein the optical switches comprise thermocapillary switches.

56. The device of claim 55, wherein the optical switches comprise bubblejet switches.

57. The device of claim 1, further comprising:
a cellular communications network including micro-strip delay lines in thermal contact with the plurality of thermoelectric elements and configured to control a temperature of the micro-strip delay lines in the cellular communications network.

58. The device of claim 1 wherein the plurality of thermoelectric elements are configured to provide cooling and/or heating response times on the order of tens of $\mu s$ (microseconds) or less.

59. The device of claim 1 wherein the plurality of thermoelectric elements are configured to provide cooling and/or heating at flux levels in a range of 0.1 W/cm$^2$ to about 2000 W/cm$^2$.

60. A thermoelectric cooling and heating device comprising:
a substrate;
a plurality of thermoelectric elements arranged on one side of the substrate and configured to perform at least one of selective heating and cooling, each thermoelectric element including, a thermoelectric materlal, a Peltier contact contacting the thermoelectric material and configured to form under electrical current flow at least one of a heated junction and a cooled junction, and electrodes configured to provide current through the thermoelectric material and the Peltier contact; and
a surface header contacting said plurality of thermoelectric elements and having a transverse thermal conductivity across a thickness of said surface header which is higher than a lateral thermal conductivity along a plane of the surface header, wherein the surface header comprises a high thermal conductivity material in a low thermal conductivity matrix of a solid material and is patterned on an array grid such that the high thermal conductivity material of the surface header aligns with the thermoelectric elements.

61. The device of claim 60, wherein the thermoelectric material comprises:
an n-type thermoelectric material; and
a p-type thermoelectric material with the Peltier contact abridging the n-type and p-type thermoelectric materials such that the electrodes contact a side of the n-type thermoelectric material opposite the Peltier contact and a side of the p-type thermoelectric material opposite the Peltier contact.

62. The device of claim 61, further comprising:
a controller configured to selectively bias the electrodes of each of the thermoelectric elements in at least one of a first direction to form said cooled junction and a second direction to form said heated junction.

63. The device of claim 61, wherein both the n-type thermoelectric material and the p-type thermoelectric material comprise thin-film thermoelectric layers less than 10 μm (micrometer) thick.

64. The device of claim 61, wherein both the n-type thermoelectric material and the p-type thermoelectric material comprise high ZT thermoelectric materials.

65. The device of claim 64, wherein the ZT thermoelectric materials comprise superlattice structured thin-film materials.

66. The device of claim 65, wherein the superlattice structured thin-film materials comprise high-ZT materials including at least one of Bi$_2$Te$_3$-based superlattice materials, Si/Ge superlattice materials, and PbTe-based superlattice materials.

67. The device of claim 60, wherein the thermoelectric elements comprise microelectronically patterned thin-film thermoelectric elements.

68. The device according to claim 60 further comprising:
a controller configured to separately control at least a first electrode of a first thermoelectric element and a second electrode of a second thermoelectric element, the controller being further configured to bias the first and second electrodes to provide simultaneous heating of a first portion of the substrate adjacent the first thermoelectric element and cooling of a second portion of the substrate adjacent the second thermoelectric element.

69. The device of claim 60, further comprising:

a receptacle thermally contacting the thermoelectric elements and including an array of patches configured to receive a biological material.

70. The device of claim 60, further comprising:

a microsurgical tool thermally contacting the thermoelectric elements and configured to control the temperature of bio-tissues in contact with the microsurgical tool.

71. The device of claim 60, further comprising:

a thermo-optic phase shifter in thermal contact with the plurality of thermoelectric elements and configured to vary an index of refraction of an optical medium via temperature variations.

72. The device of claim 60, further comprising:

at least one laser thermally coupled to the plurality of thermoelectric elements and having a semiconductor material defining a band gap varied by temperature variations of the thermoelectric elements so as to control a lasing frequency of the at least one laser.

73. The device of claim 60, further comprising:

an integrated module including at least one electronic component in thermal contact with the plurality of thermoelectric elements and configured to control a temperature of the at least one electronic component of the integrated module.

74. The device of claim 60, further comprising:

a switching optical network including optical switches in thermal contact with the plurality of thermoelectric elements and configured to control a temperature of the optical switches in the switching optical network.

75. The device of claim 60, further comprising:

a cellular communications network including micro-strip delay lines in thermal contact with the plurality of thermoelectric elements and configured to control a temperature of the micro-strip delay lines in the cellular communications network.

76. The device of claim 60 wherein the plurality of thermoelectric elements are configured to provide cooling and/or heating response times on the order of tens of $\mu s$ (microseconds) or less.

77. The device of claim 60 wherein the plurality of thermoelectric elements are configured to provide cooling and/or heating at flux levels in a range of 0.1 $W/cm^2$ to about 2000 $W/cm^2$.

* * * * *

UNITED STATES PATENT AND TRADEMARK OFFICE
CERTIFICATE OF CORRECTION

PATENT NO. : 7,164,077 B2  
APPLICATION NO. : 10/118236  
DATED : January 16, 2007  
INVENTOR(S) : Venkatasubramanian It is certified that error appears in the above-identified patent and that said Letters Patent is hereby corrected as shown below:

On The Title Page:

Item [73] Correct to read: --Assignee: Nextreme Thermal Solutions, Inc., Research Triangle Park, NC (US)--

On Title Page

Item [56] Add: --6,381,965     5/7/2002--

Column 23,

Line 42, Claim 13: [1 to 500 m.] Correct to read: --1 to 500 µm.--

Signed and Sealed this

Twenty-fourth Day of April, 2007

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,164,077 B2 | Page 1 of 1 |
| APPLICATION NO. | : 10/118236 | |
| DATED | : January 16, 2007 | |
| INVENTOR(S) | : Venkatasubramanian | |

It is certified that error appears in the above-identified patent and that said Letters Patent is hereby corrected as shown below:

Column 1, Line 23: Please insert:
--STATEMENT OF GOVERNMENT RIGHTS
The U.S. Government has a paid-up license in this invention and the right in limited circumstances to require the patent owner to license others on reasonable terms as provided for by the terms of Navy Contract No. N00014-97-C-0211 awarded by the Office of Naval Research.--

Signed and Sealed this

Twenty-fourth Day of June, 2008

JON W. DUDAS
*Director of the United States Patent and Trademark Office*